(12) United States Patent
Desrosiers et al.

(10) Patent No.: US 12,040,758 B2
(45) Date of Patent: Jul. 16, 2024

(54) CURRENT SENSING CIRCUIT WITH INTEGRATED RESISTOR AND SWITCH MATRIX

(71) Applicant: Avago Technologies International Sales Pte. Limited, Singapore (SG)

(72) Inventors: Ryan Desrosiers, Fort Collins, CO (US); Jay Ackerman, Loveland, CO (US); Mark Rutherford, Wellington, CO (US)

(73) Assignee: Avago Technologies International Sales Pte, Limited, Singapore (SG)

( * ) Notice: Subject to any disclaimer, the term of this patent is extended or adjusted under 35 U.S.C. 154(b) by 195 days.

(21) Appl. No.: 17/855,294

(22) Filed: Jun. 30, 2022

(65) Prior Publication Data
US 2024/0007063 A1   Jan. 4, 2024

(51) Int. Cl.
*H03F 1/02* (2006.01)
*H02J 50/10* (2016.01)
*H02J 50/60* (2016.01)
*H03F 3/217* (2006.01)
*H03F 3/45* (2006.01)

(52) U.S. Cl.
CPC ............ *H03F 3/2178* (2013.01); *H02J 50/10* (2016.02); *H02J 50/60* (2016.02); *H03F 3/45475* (2013.01); *H03F 2200/462* (2013.01); *H03F 2203/21184* (2013.01); *H03F 2203/21191* (2013.01)

(58) Field of Classification Search
CPC ............ H03F 3/2178; H03F 2200/462; H03F 2203/21184; H03F 2203/21191; H03F 3/72; H03F 1/0277; H03F 1/02; H03F 3/45475; H03F 1/303; H03F 3/005; H02J 50/10; H02J 50/60; H03G 1/0088
See application file for complete search history.

(56) References Cited

U.S. PATENT DOCUMENTS

| 8,633,766 | B2 | 1/2014 | Khlat et al. |
| 9,342,400 | B2 | 5/2016 | Nabhane et al. |
| 10,043,559 | B2 | 8/2018 | Sandhu et al. |
| 10,250,210 | B2 | 4/2019 | Mengad et al. |
| 10,263,581 | B2 | 4/2019 | Wan |
| 10,523,340 | B2 | 12/2019 | Choi et al. |
| 10,803,911 | B2 * | 10/2020 | Arno ................ G06F 1/189 |
| 11,175,319 | B1 * | 11/2021 | Guedon ........... G01R 19/0092 |
| 2016/0049807 | A1 | 2/2016 | Thompson et al. |
| 2017/0047896 | A1 * | 2/2017 | Shu .................. H03F 3/387 |

(Continued)

FOREIGN PATENT DOCUMENTS

KR   20150117681 A   10/2015

*Primary Examiner* — Khanh V Nguyen
(74) *Attorney, Agent, or Firm* — Quarles & Brady LLP

(57) ABSTRACT

An integrated circuit for measuring current while receiving wireless power is described. The integrated circuit measures a current across a resistor by an amplifier. A gain of the amplifier is based on a pair of matched upstairs resistors and a pair of matched downstairs resistors. The pair of matched upstairs resistors may include an offset in resistance. The integrated circuit includes a switch matrix with switches coupled between the integrated resistor and the pair of matched upstairs resistors. The offset for the pair of matched upstairs resistors may be measured by selectively controlling the switches.

20 Claims, 12 Drawing Sheets

(56) References Cited

U.S. PATENT DOCUMENTS

| | | |
|---|---|---|
| 2018/0101188 A1 | 4/2018 | Kurs et al. |
| 2021/0067114 A1 | 3/2021 | Ivanov et al. |
| 2022/0074974 A1 | 3/2022 | Lee et al. |
| 2022/0416740 A1* | 12/2022 | Spina .................. H03F 3/387 |

* cited by examiner

CURRENT SENSING CIRCUIT WITH INTEGRATED RESISTOR AND SWITCH MATRIX

TECHNICAL FIELD

The present invention generally relates to wireless power, and more specifically to current sensing.

BACKGROUND

Current sensing is one block in wireless power systems. The sensed current together with the voltage measurement provide a power measurement of the system. The power measurement is critical for understanding how much power is actually being received from the transmitter and delivered to a load, such as a battery. In particular, wireless power systems have to measure power very accurately to help with foreign object detection. Undesirably, a foreign object may receive power from a transmitter and begin overheating. The receiver may include a current sensing functionality to measure the power received for determining the power lost to the foreign object. Power losses due to foreign objects may be predicted by more accurately determining the current received. Thus, it is desirable to determine the current received to a given level of accuracy. However, the current sensing function of the wireless power system may include inaccuracies introduced by one or more sources.

In view of the above, one or more embodiments of the present disclosure provide an integrated circuit including an improved current sense capability.

SUMMARY

An integrated circuit is described, in accordance with one or more illustrative embodiments of the present disclosure. In some embodiments, the integrated circuit comprises a first resistor coupled between a first node and a second node. In some embodiments, the first resistor includes a first resistance (Rs). In some embodiments, the first resistor is configured to carry a first current (Isns) across the first resistor when the first node includes a first voltage (Vrect) and the second node includes a second voltage (Vmid). In some embodiments, the integrated circuit comprises an amplifier configured to output a third voltage (Vo). In some embodiments, the integrated circuit comprises a second resistor and a third resistor. In some embodiments, the second resistor and the third resistor each include a second resistance (Rt). In some embodiments, the second resistor is coupled between the first node and a first input of the amplifier. In some embodiments, the third resistor is coupled between the second node and a second input of the amplifier. In some embodiments, the integrated circuit comprises a fourth resistor and a fifth resistor. In some embodiments, the fourth resistor and the fifth resistor each include a third resistance (Rb). In some embodiments, the fourth resistor is coupled between a first output of the amplifier and ground. In some embodiments, the fifth resistor is coupled between a second output of the amplifier and ground. In some embodiments, the third voltage (Vo) is proportional to the third resistance (Rb). In some embodiments, the integrated circuit comprises a switch matrix comprising a first switch (M1) coupled between the first node and the second resistor, a second switch (M2) coupled between the second node and the third resistor, a third switch (M3) coupled between the second node and the second resistor, and a fourth switch (M4) coupled between the first node and the third resistor. In some embodiments, the integrated circuit comprises a processor configured to receive one or more digital signals of the third voltage (Vo) and configured to determine the first current (Isns) based on the third voltage (Vo). In some embodiments, the processor is configured to measure an offset of the current sense circuit by the first switch (M1), the second switch (M2), the third switch (M3), and the fourth switch (M4). In some embodiments, the processor is configured to compensate for the first offset and the second offset when determining the first current (Isns).

A wireless power system is described, in accordance with one or more illustrative embodiments of the present disclosure. In some embodiments, the wireless power system comprises a coil. In some embodiments, the wireless power system comprises an integrated circuit. In some embodiments, the integrated circuit comprises a rectifier circuit configured to receive alternating current from the coil and generate a first voltage (Vrect). In some embodiments, the integrated circuit comprises a current sense circuit. In some embodiments, the current sense amplifier comprises a first resistor coupled between a first node and a second node. In some embodiments, the first resistor includes a first resistance (Rs). In some embodiments, the first resistor is configured to carry a first current (Isns) across the first resistor when the first node includes the first voltage (Vrect) and the second node includes a second voltage (Vmid). In some embodiments, the current sense circuit comprises an amplifier configured to output a third voltage (Vo). In some embodiments, the current sense circuit comprises a second resistor and a third resistor. In some embodiments, the second resistor and the third resistor each include a second resistance (Rt). In some embodiments, the second resistor is coupled between the first node and a first input of the amplifier. In some embodiments, the third resistor is coupled between the second node and a second input of the amplifier. In some embodiments, the current sense circuit comprises a fourth resistor and a fifth resistor. In some embodiments, the fourth resistor and the fifth resistor each include a third resistance (Rb). In some embodiments, the fourth resistor is coupled between a first output of the amplifier and ground. In some embodiments, the fifth resistor is coupled between a second output of the amplifier and ground. In some embodiments, the third voltage (Vo) is proportional to the third resistance (Rb). In some embodiments, the current sense circuit comprises a switch matrix comprising a first switch (M1) coupled between the first node and the second resistor, a second switch (M2) coupled between the second node and the third resistor, a third switch (M3) coupled between the second node and the second resistor, and a fourth switch (M4) coupled between the first node and the third resistor. In some embodiments, the integrated circuit comprises a voltage regulator circuit configured to regulate the second voltage (Vmid). In some embodiments, the integrated circuit comprises a processor configured to determine the first current (Isns) based on one or more digital signals of the third voltage (Vo). In some embodiments, the processor is configured to measure an offset of the current sense circuit by the first switch (M1), the second switch (M2), the third switch (M3), and the fourth switch (M4). In some embodiments, the processor is configured to compensate for the first offset and the second offset when determining the first current (Isns). In some embodiments, the wireless power system comprises a battery charging system.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Figure 1A:
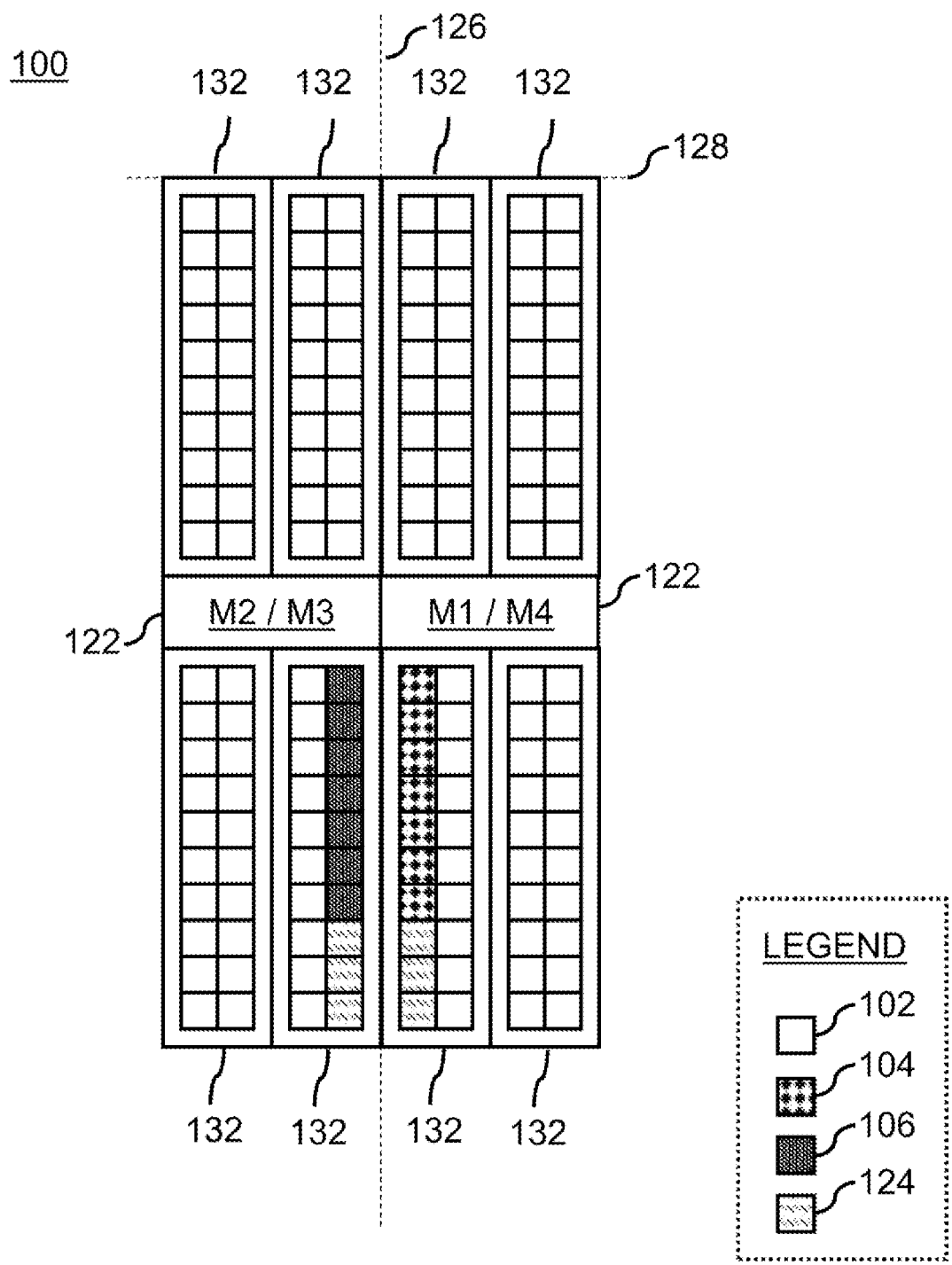
FIGS. 1A-1C depicts a top view of a layout of components of a current sense circuit, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1 b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings.

A current sensing circuit may undesirably include an offset introduced into measurement. The offset may be introduced by process variations and pressure variations in a resistor array of polysilicon sheets which are provided as the input to an amplifier. In particular, the upstairs resistor array may include process variations, pressure/stresses, and the like, which impact a resistance value for one or more upstairs resistors and similarly introduce the offset for the structure. The upstairs resistors are coupled to an input of an amplifier. The output of amplifier is provided to an analog-to-digital converter (ADC). A processor may receive the measurement from the ADC (e.g., a digital signal of the gained-up voltage). The processor may include firmware or other processor executable code.

Embodiments of the present disclosure are generally directed to an integrated circuit which includes a current sense circuit with switches. The switches are provided in series with the resistors which are input to an amplifier. By the switches, the current sense amplifier circuit may be implemented with a transmit (Tx) power mode, a receive (Rx) power mode, and a direct offset measurement of the structure. The offset measurement may improve the accuracy of the current sense amplifier, which is desirable for high accuracy environments.

Referring generally to FIGS. 1A-6 a current sense circuit 100 is described. The current sense circuit 100 may be configured to measure current across a wide range of voltages, such as up to 24 volts, or more. The current sense circuit 100 may be configured to measure current with a relatively large dynamic range, such as, but not limited to, between 1 milli-amp up to 2.5 amps, or more. The accuracy of the current sense circuit 100 is contemplated to be within 0.5 percent of the actual current across the dynamic range of currents by one or more layout configurations, a switching matrix for determining offset, and a dual channel approach for analog and digital control loops. Although the current sense circuit 100 is depicted as including the various components contained in the respective arrangements, this is not intended as a limitation of the present disclosure. It is further contemplated that the current sense circuit 100 and may include various additional components which are not depicted. It is noted herein "coupled" may mean one or more of "communicatively coupled to," "electrically coupled to," and/or "physically coupled to," for purposes of the present disclosure. As used herein, coupled may refer to a direct or indirect coupling. An indirect coupling may refer to a connection via another functional element. A direct coupling may refer to a connection without intermediary elements. It is noted herein that by being "coupled between", it may be understood to be relative to movement or flow of the signal between two more components, and may additionally include intervening components therein.

Figure 1B:
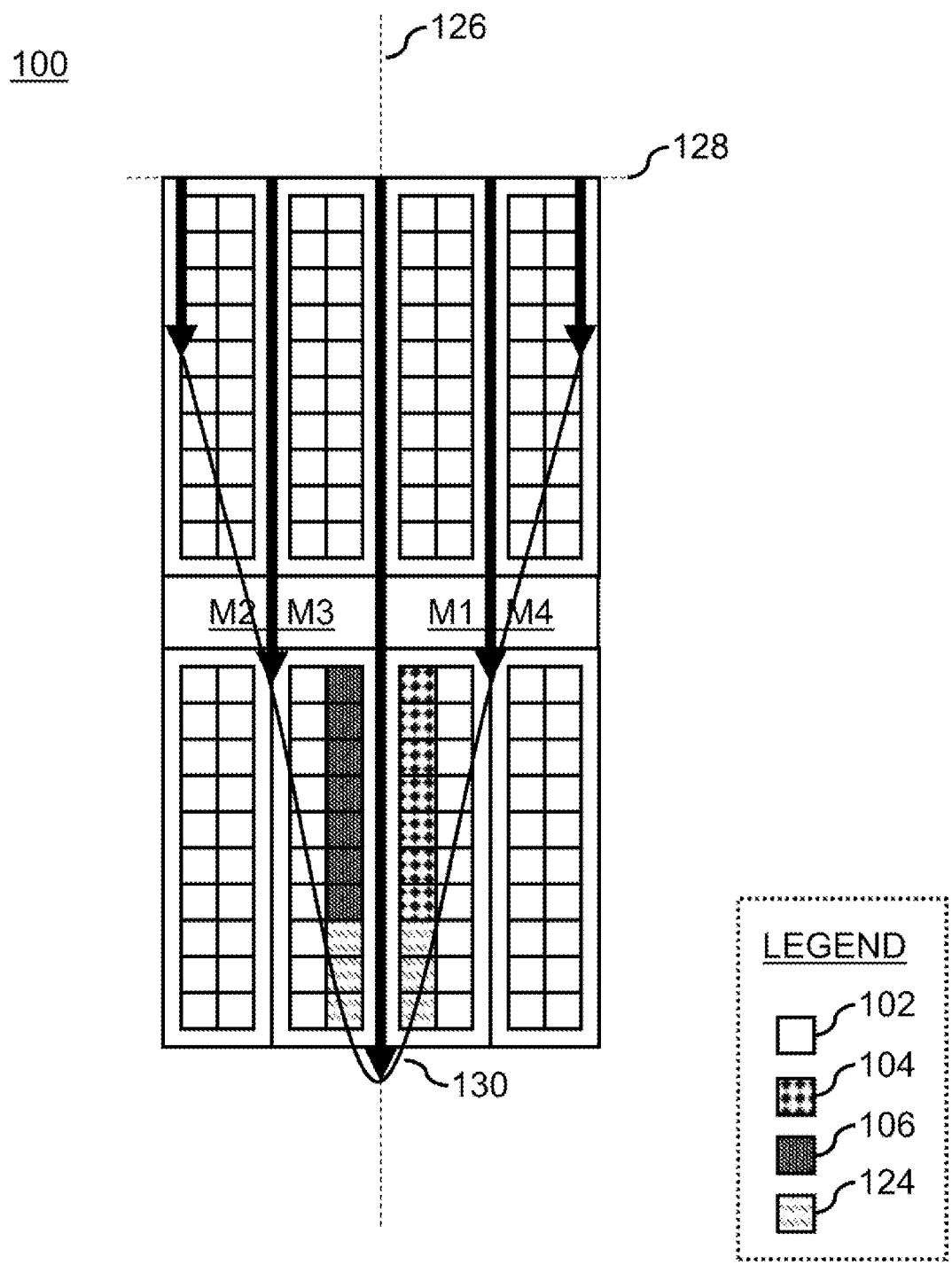
Figure 1C:
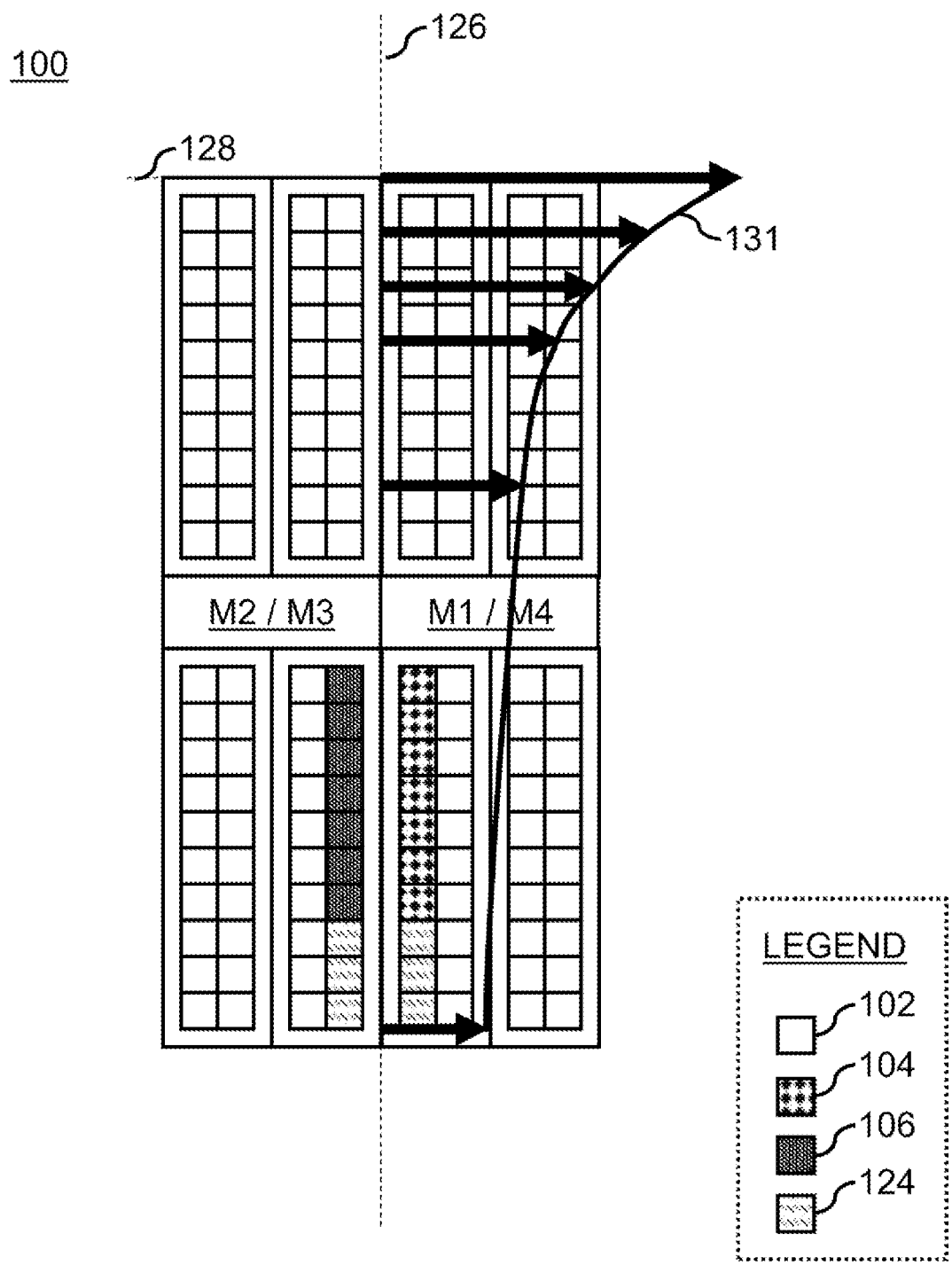

Referring now to FIGS. 1A-1C, a layout of one or more components of a current sense circuit 100 is described, in accordance with one or more embodiments of the present disclosure.

The current sense circuit 100 may include one or more of a resistor 102, a resistor 104, and a resistor 106. The resistor 102 may also be referred to herein as a sense resistor having a resistance (Rs). For example, the resistance (Rs) may be 20 milli-ohms, although this is not intended to be limiting. A range of values for the resistor 102 are contemplated around the exemplary 20 milli-Ohm resistor. In this regard, the resistance value may be selected to be on the order of 1 to 100 milli-Ohm, or greater. The resistor 104 and the resistor 106 may be connected to the input of an amplifier 108, such that the resistor 104 and the resistor 106 may also be referred to herein as upstairs resistors. The resistor 104 and the resistor 106 may each include a resistance (Rt), such that the resistor 104 and the resistor 106 may also be referred to as a pair of matched resistors. For example, the resistance (Rt) may be 1 kilo-ohm (e.g., 1 kΩ resistor), although this is not intended to be limiting. The current sense circuit 100 may further include one or more dummy resistors 124. The current sense circuit 100 may further include one or more switches 122 (e.g., switch (M1), a switch (M2), a switch (M3), and a switch (M4). The switches (M1-M4) may be provided for measuring an offset of the current sense circuit which is due to the resistor 104, the resistor 106, the resistor 110, the resistor 112, and the amplifier 108, as will be described further herein.

As depicted in FIG. 1A, the resistor 102, the resistor 104, the resistor 106, and the dummy resistor 124 are depicted with different hatching which is not intended to be limiting. Rather, the resistor 102, the resistor 104, the resistor 106, and the dummy resistor 124 are depicted with the hatching to illustrate the number of the array elements included with each resistor. It is contemplated that the layout of the resistor 102, the resistor 104, and the resistor 106 may be advantageous for any number of current sense circuit which sense current over a milliamp to amp range.

In embodiments, the resistor 102, the resistor 104, and the resistor 106 each include a polysilicon resistor formed onto a substrate. The polysilicon resistor may also be referred to herein as a poly resistor or an internal poly resistor. In embodiments, the polysilicon resistor is formed as an array of the array elements each including the polysilicon sheets. FIG. 1A depicts the resistor 102 as including one hundred and forty of the array elements, the resistor 104 as including 7 of the array elements, the resistor 106 as including 7 of the array elements, and the dummy resistor 124 as including 6-array elements, although this is not intended to be limiting. Furthermore, although not depicted, the array elements for each of the resistor 102, the resistor 104, and the resistor 106 may be coupled in any number of series or parallel arrangements to achieve a desired resistance value. As further depicted in FIG. 2, each array element may include a number of polysilicon sheets. For example, the array elements may also be referred to as 10× resistors, such that each array element includes 10 polysilicon sheets (also referred to as fingers), although this is not intended to be limiting. The resistor 102 may thus include 1400 polysilicon sheets and the resistor 104 and the resistor 106 may each include 70 polysilicon sheets.

Thus, the resistor 102, the resistor 104, and the resistor 106 may each be formed as a plurality of polysilicon sheets. The polysilicon sheets may comprise any polysilicon material known in the art, such as, but not limited to, doped or undoped polysilicon films. The polysilicon sheets may be disposed on a same layer of the integrated circuit, such as below metallization layers. The polysilicon sheets may include a resistance which changes with temperature. The use of the polysilicon sheets may be advantageous for reducing the temperature coefficient, as compared to implementing the resistor 102, the resistor 104, and the resistor 106 in metallization layers of the integrated circuit. For example, the polysilicon sheets may include a temperature coefficient of resistance (TCR) between 150 and 160 parts per million per degrees Celsius (PPM/C), although this is not intended to be limiting. The polysilicon sheets may each include a resistance value. For example, the polysilicon sheets may each include a sheet resistance of 300 ohms per square, although this is not intended to be limiting. The polysilicon sheets may be arranged in parallel and/or in series. The parallel and/or series arrangement of the polysilicon sheets may be used to form the resistor array for the polysilicon resistor with the select resistance value. The resistance (Rs) for the sense resistor, the resistance (Rt) for the upstairs resistor, and the resistance (Rb) for the downstairs resistor be based on the number and arrangement of the array of polysilicon sheets. The number of resistor elements for the array used to form the resistor 102 may be substantially more than the number of resistor elements used to form the upstairs resistor. Providing substantially more of the resistor elements 102 than the upstairs resistors may cause the resistance (Rs) to be substantially less than the resistance (Rt). Consider the example where there are one hundred and forty array elements for the resistor 102, with each array element including 10 polysilicon sheets. In this example, the resistor 102 may consist of 1400 polysilicon sheets in parallel to realize a 20 milli-ohm resistance value for the resistance (Rs), although this is not intended to be limiting.

It may be desirable to ensure that the resistor 104 and the resistor 106 have as closed to a matched resistance value as possible, such as to ensure appropriate gain for one or more amplifiers of the current sense circuit. One challenge with implementing the resistors 102, the resistors 104, and the resistors 104 is due to a piezoresistive nature of polysilicon. In this regard, the resistance (Rs) and the resistance (Rt) may change when the polysilicon sheets are subject to pressure. Each of the resistor 104 and the resistor 106 may be subject to stress due the pressure. In some instances, the stress of the resistor 104 may be different than the stress of the resistor 106, which may also be referred to herein as a stress differential.

As depicted in FIG. 1B, a plot 130 of a stress gradient of the integrated circuit may be decreased away from the axis 126 and may further be symmetric about the axis 126. Similarly, plot of resistance (not depicted) as a function of distance may see a change in the resistance away from the axis. As further depicted in FIG. 1C, a plot 131 of a stress gradient of the integrated circuit may be varied away from the die edge 128. For example, the stress gradient may be highest at the die edge 128 and decrease non-linearly across the die, such that the stress gradient from the die edge 128 across the integrated circuit is non-linear. Similarly, plot of resistance (not depicted) as a function of distance may see a change in the resistance away from the die edge 128. As may be understood, the plot 130 and the plot 131 are not intended to be limiting. In this regard, the plot 130 and the plot 131 may include lot-to-lot variation and/or part-to-part variation.

In embodiments, the resistor 104 and the resistor 106 may be symmetrically arranged about the stress gradient to minimize the change in resistance due to piezo resistivity.

In embodiments, the resistor 104 and the resistor 106 include array elements with the polysilicon sheets which are symmetrically arranged about an axis 126. The axis 126 may include a central axis. In this regard, the stress differential between the polysilicon sheets of the resistor 104 and the resistor 106 may be reduced, thereby causing the matched pair of resistors to experience a similar stress, and similarly experiences a similar change in resistance due to piezo resistivity. Causing the matched pair of resistors to experience similar changes in resistance may be particularly advantageous where the resistors are each coupled to the inlet of a differential amplifier, thereby improving the accuracy of the differential amplifier.

In embodiments, the resistor 104 and the resistor 106 include array elements with the polysilicon sheets which are arranged at a same distance from a die edge 128 of the integrated circuit. The resistor 104 and the resistor 106 may be piezoresistive and change resistance due to pressure. The change in resistance due to pressure may influence an offset and a gain of a downstream amplifier. By arranging the resistor 104 and the resistor 106 at the same distance from axis 126 and die edge 128, a stress differential between the resistors may be reduced. Reducing the stress differential may cause the resistors to experience similar changes in resistance. Having the resistors at the same distances from the chip edge may thus minimally impact offset and gain of a downstream amplifier (e.g., wherein the resistor 104 and the resistor 106 are inputs to the amplifier), as compared to placing the resistor 104 and the resistor 106 at different distances from the die edge 128.

The resistor 104 and the resistor 106 may also be placed at a distance away from the die edge within a part of the stress gradient which is flatter than the regions closer to the die edge. In this regard, the resistance for the matched pair of resistors may be minimally changed, thereby minimizing an impact on a gain of an amplifier. For example, one or more array elements of the resistor 102 and one or more of the switches (M1-M4) may be placed between the die edge 128 and the resistor 104, 106, thereby spacing the resistor 104, 106 from the die edge 128.

As depicted, the layout may include an array of the resistors. The array may be separated based on one or more deep n-well (DNW) regions 132 of the integrated circuit, although this is not intended to be limiting. In this regard, the resistors may be placed in a layer above the DNW regions 132. For example, FIG. 1A depicts a 2×4 array of the DNW regions 132, with each of the DNW regions 132 include two rows with each row having ten of the array elements. As further depicted, the first 1×4 array of DNW regions 132 is separated from the second 1×4 array of the DNW regions 132 by the switches (M1-M4). Although the DNW regions 132 are depicted as including twenty of the array elements, this is not intended as a limitation of the present disclosure. The DNW regions 132 may generally include any suitable number for achieving a desired resistance. For example, the DNW regions 132 may include 22 of the array elements per DNW region (i.e., rows of 11 of the array elements). In this example, the total number of array elements may be 176 elements (i.e., 2×4 array of DNW regions each including 22 elements per region). Where each element includes 10 fingers or polysilicon sheets, the array may include 1760 polysilicon sheets. To achieve the 20 milli-ohm resistance for the resistor 102, 1400 of the 1760 polysilicon sheets may be used, for a total of one hundred and forty array elements. To achieve the 1 kΩ resistance for each of the resistor 104 and the resistor 106, 70 of the array elements may be used. The remaining layout may include twelve of the array elements which are unused (e.g., the dummy resistor 124).

In embodiments, the resistor 104 and the resistor 106 are both symmetrically arranged about the axis 126 and disposed at the same distance from the die edge 128, as depicted. The resistors may still experience stress causing a change in resistance. Advantageously, the resistivity for the resistor 104 and the resistor 106 change at a similar rate same. The resistivity may change at a similar rate because the resistors are both the same distance away from the edge 128 and are in the same orientation with respect to the axis 126. The resistance (Rt) for each resistor may thus be more closely matched. For example, the array elements of the resistor 104 and the resistor 106 are depicted as being disposed in separate of the DNW regions 132 which are closest to the axis 126 and separated from the die edge 128 by a second group of the DNW regions 132.

The resistor 102 may include one or more rows of the array elements including the polysilicon sheets. One or more rows of the resistor 102 are disposed between the die edge 128 and the polysilicon sheets of the resistor 104. Similarly, one or more rows of the resistor 102 are disposed between the die edge 128 and the polysilicon sheets of the resistor 104. The rows may be considered to be closer to the die edge 128 and may also be disposed within a region experiencing a higher stress concentration. Thus, the resistor 102 may experience relatively more change due to piezo resistance than the resistor 104 or the resistor 106. For example, the resistor 102 is depicted as including fourteen rows of the array elements, with each row having ten of the array elements. The resistor 102 is further depicted as including eight of the rows between the die edge 128 and the resistor 104 or the resistor 124.

The resistor 102 may additionally include one or more rows of the array elements which are arranged at the same distance from the die edge 128 as the resistor 104 or the resistor 106. The rows which are arranged at the same distance may also be symmetrically arranged about the axis 126. The polysilicon sheets of the resistor 104 and the resistor 106 may also be disposed between one or more rows of the first resistor 102. For example, the resistor 104 and the resistor 106 are depicted as being disposed between three rows of the resistor 102 which are symmetrically arranged about the axis, which are all disposed at the same distance from the die edge 128. The resistor 102 may thus include a layout which reduces space between the resistor 104 and the resistor 106 for better matching.

The resistor 102, the resistor 104, and the resistor 106 may be disposed in a same layer of the circuit for reducing a temperature differential. In embodiments, the resistor 104 and the resistor 106 may be interdigitated to reduce a temperature differential between the resistor 104 and the resistor 106. Decreasing the temperature differential may be valuable in minimizing an error due to changes in the resistance due to temperature.

Interdigitating may refer to mingling one or more subcomponents of a first component with one or more subcomponents of a second component. For example, an array may include polysilicon sheets of a first component which are interdigitated with polysilicon sheets of a second component. By way of another example, a switch matrix may include a first switch which is interdigitated with a second switch on a layer to match a channel resistance. Channel resistance may refer to resistance from drain to source.

The integrated circuit may further be configured to directly measure offset. The current sense circuit 100 may further include one or more switches. For example, the switches may include four switches (M1-M4). The switches (M1-M4) may be provided for measuring an offset. The switches (M1-M4) may also be symmetrically arranged about a stress gradient. For example, the switch (M2) and the switch (M3) may be symmetric relative to the switch (M1) and the switch (M4) about the axis 126.

The switches (M1-M4) may be disposed on a same layer as the resistor 102, the resistor 104, and the resistor 106. In embodiments, the switch (M1) may be interdigitated with switch (M4). Similarly, the switch (M2) may be interdigitated with (M3). Interdigitating the switches may be beneficial in matching the channel resistance of switch (M1) and switch (M4) and similarly matching the channel resistance of switch (M2) and switch (M3). It is contemplated that there are alternative ways to lay out the switches (M1-M4). For example, the switch (M1) and the switch (M4) may be separated and may be arranged in any order with the switch (M2) and the switch (M3). The switch (M1) and the switch (M4) may also be symmetrically arranged to the switch (M2) and the switch (M3) about the axis.

Figure 2A:
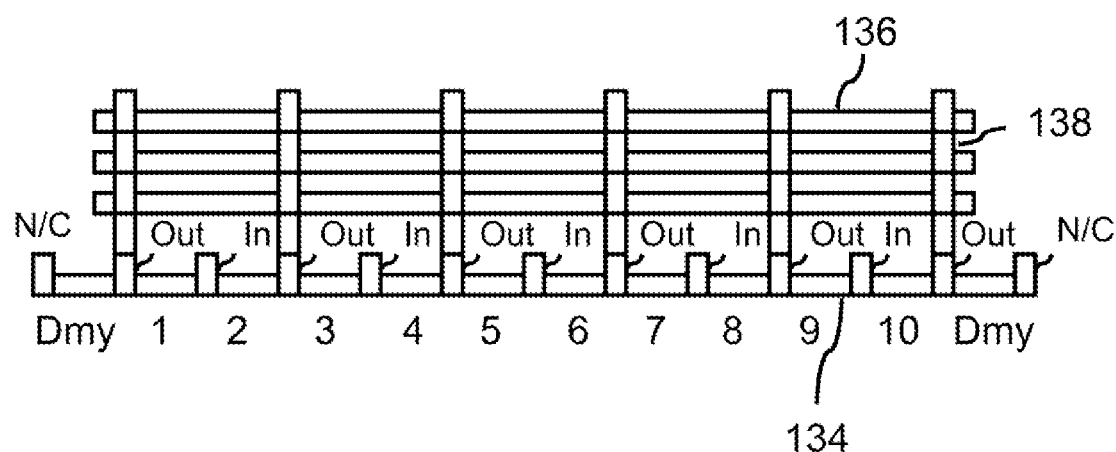
FIGS. 2A-2B depicts a side view of a layout of components of a current sense circuit, in accordance with one or more embodiments of the present disclosure.
Figure 2B:
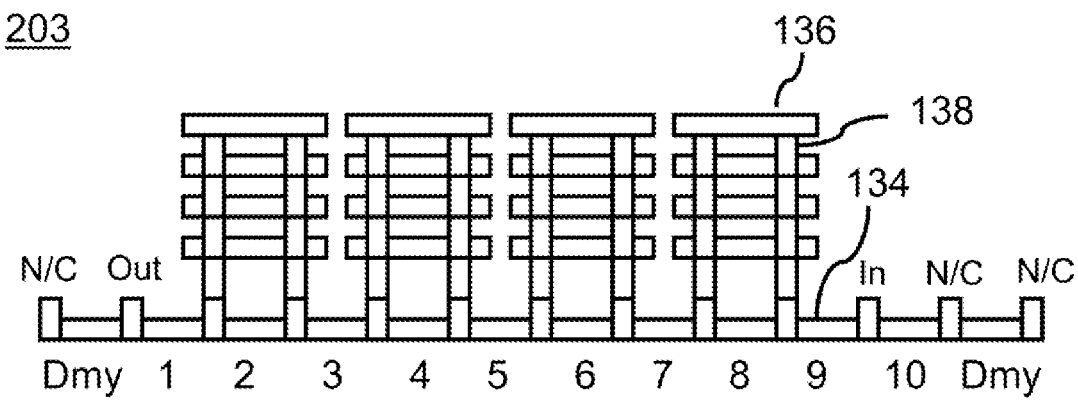

Referring generally to FIGS. 2A-2B, an array element of a polysilicon resistor is described. The polysilicon resistor may include one or more of the resistor 102, the resistor 104, or the resistor 106. The array element may include one or more polysilicon sheets 134 and one or more metallization layers 136. The array element may further include one or more vias 138 connecting the polysilicon sheets 134 to the metallization layers 136.

The array element may include any number of the polysilicon sheets 134. For example, the array element may include twelve of the polysilicon sheets 134 (e.g., two dummy sheets and sheets 1-10), although this is not intended to be limiting. As depicted, the array element 201 and the array element 203 each include ten of the polysilicon sheets (1-10) which are coupled and two dummy polysilicon sheets (Dmy). The polysilicon sheets 134 may include a range of suitable dimensions. For example, the polysilicon sheets 134 may be relatively wide, such as, but not limited to, 50 microns wide. The polysilicon sheets 134 may further include a length, such as, but not limited to, 4 microns long. The aspect ratio of the polysilicon sheets 134 may thus be 50 microns by 4 microns, although this is not intended to be limiting. The polysilicon sheets with an aspect ratio of 50 microns by 4 microns have been experimentally determined to include a temperature coefficient of 150 PPM/C. Sizing the polysilicon sheets to have the same aperture and similarly the same temperature coefficient may be beneficial in cancelling the temperature coefficient for the resistance (Rs) and the resistance (Rt).

The connections between the plurality of polysilicon sheets 134 are routed between one or more of the metallization layers 136. The metallization layers 136 of the integrated circuit may be resistive, in addition to the polysilicon sheets 134. Thus, the resistance value for the array element may be based on the array itself together with the metallization layers for getting the current in and out of the polysilicon sheets 134. The metallization layer may be formed of one or more materials, such as, but not limited to copper. The layer may include a resistivity which is inversely proportional to the thickness. As depicted, the array elements may include four metallization layers. Although the array elements are depicted as including four metallization layers, this is not intended to be limiting. For example, each array element may include six metallization layers (m1-m6). The layers (m1-m5) may be relatively thin and include a sheet resistivity (e.g., 300 milli-Ohms per square). The layers (m1-m5) may be a high-density metal interconnect for various digital signals. In contrast, the layer (m6) may be relatively thick when compared to the layers (m1-m5) and include a sheet resistivity which is relatively low (e.g., 4 milli-Ohms per square). The layer (m6) may be provided for analog pathing with high currents. The layer (m6) may also be described as a top layer or a package layer. The metallization layers (m1-m6) may be provided as one or more parallel layers. The parallel layers may be disposed on top of the polysilicon sheet layer. The polysilicon sheet layer may be disposed on top of one or more deep n-well (DNW) layers.

When designing a current sense circuit, parasitic resistance due to the path leading between the polysilicon sheets 134 results in an error term. A mismatch between the upstairs resistors of the current sense circuit may lead to a significant percent error. For instance, where the resistor 104 and the resistor 106 are 1 kΩ resistors, 1 Ohm of resistance mismatch results in a 0.1% error. Three squares of metal in the layers (m1-m5) may cause such error. In embodiments, the connections between the polysilicon sheets 134 may be routed between the metallization layers 136 which include lower sheet resistivity. Routing through the layers with lower sheet resistivity may minimally impact the resistance of the resistor 102, the resistor 104, or the resistor 106. For example, the layer (m6) may be used to route the connections between the polysilicon sheets 134, due to lower sheet resistivity. In this regard, connecting the polysilicon sheets 134 by the layer (m6) may reduce the ohmic resistance cause by the metallization layer.

The layers (m1-m5) may be disposed between the layer (m6) and the polysilicon sheets 134. The vias 138 may be coupled between the polysilicon sheets 134 and the metallization layer 136. For example, the vias 138 may be provided to couple the polysilicon sheets 134 with the layer (m6). The vias 138 may vertically through the layers (m1-m6) for routing the current laterally through the layer (m6). The vias 138 may also be referred to as stacked vias. The vias 138 may also include a resistivity. The resistance of the vias 138 may result in an additional error term. In embodiments, the resistance of the vias 138 is matched between the array element 201 and the array element 203. Each of the array element 201 and the array element 203 may go through the same number of vias to match the resistance. A current may then flow to the polysilicon sheet by the stacked vias, go along the polysilicon sheet, and then come up to the layer (m6) by a second set of stacked vias that comes up to a different part of the metal six layer.

Referring now to FIG. 2A, an array element 201 for the resistor 102 is described. The array element 201 of the resistor 102 may include one or more of the polysilicon sheets 134 which are coupled in parallel, such as ten of the polysilicon sheets 134 by the vias 138 and the metallization layers 136. As depicted, the resistance for the array element may be based on the resistance of the polysilicon sheets (Rpoly) and the resistance of the vias (Rcontact). In some instances, each of the polysilicon sheets 134 for each array element of the resistor 102 are coupled in parallel. By coupling each of the polysilicon sheets 134 in parallel, a resistance (Rs) for the resistor 102 may be a very low resistance. Providing the very low resistance is advantageous for minimizing power loss across the resistor 102. Each of the polysilicon sheets 1-10 may be coupled in parallel. For example, the resistance (Rs) for the resistor 102 may be 20 milli-Ohms, although this is not intended to be limiting. The resistance may be defined by the equation below:

$$R=[R\text{poly}+(2*R\text{contact})]/10$$

The resistor 102 may further include any number of the array elements 201 to achieve a desired resistance, such as one hundred and forty of the array elements 201 for the layout depicted in FIG. 1A.

Referring now to FIG. 2B, an array element 203 of the resistor 104 and the resistor 106 is described. The array element 203 may include one or more of the polysilicon sheets which are coupled in series. As depicted, the resistance for the array element may be based on the resistance of the polysilicon sheets (Rpoly) and the resistance of the vias (Rcontact). The array element 203 may include vias 138 which come up and go through a resistor sheet 9, come up through vias, and come down. The resistor sheet 8 may then be skipped. The pattern may continue where the sheets 1, 3, 5, 7, and 9 are coupled in series and the resistor sheets 2, 4, 6, and 8 skipped. In this regard, the array element 201 and the array element 203 may include a matched via resistance. For example, the resistance may be defined by the equation below:

$$\begin{aligned} R &= (5*R\text{poly}) + (10*R\text{contact}) \\ &= 5*[R\text{poly} + (2*R\text{contact})] \end{aligned}$$

The resistor 104, 106 may further include any number of the array elements 203 to achieve a desired resistance, such as 7 of the array elements 203 for the layout depicted in FIG. 1B.

Figure 3:
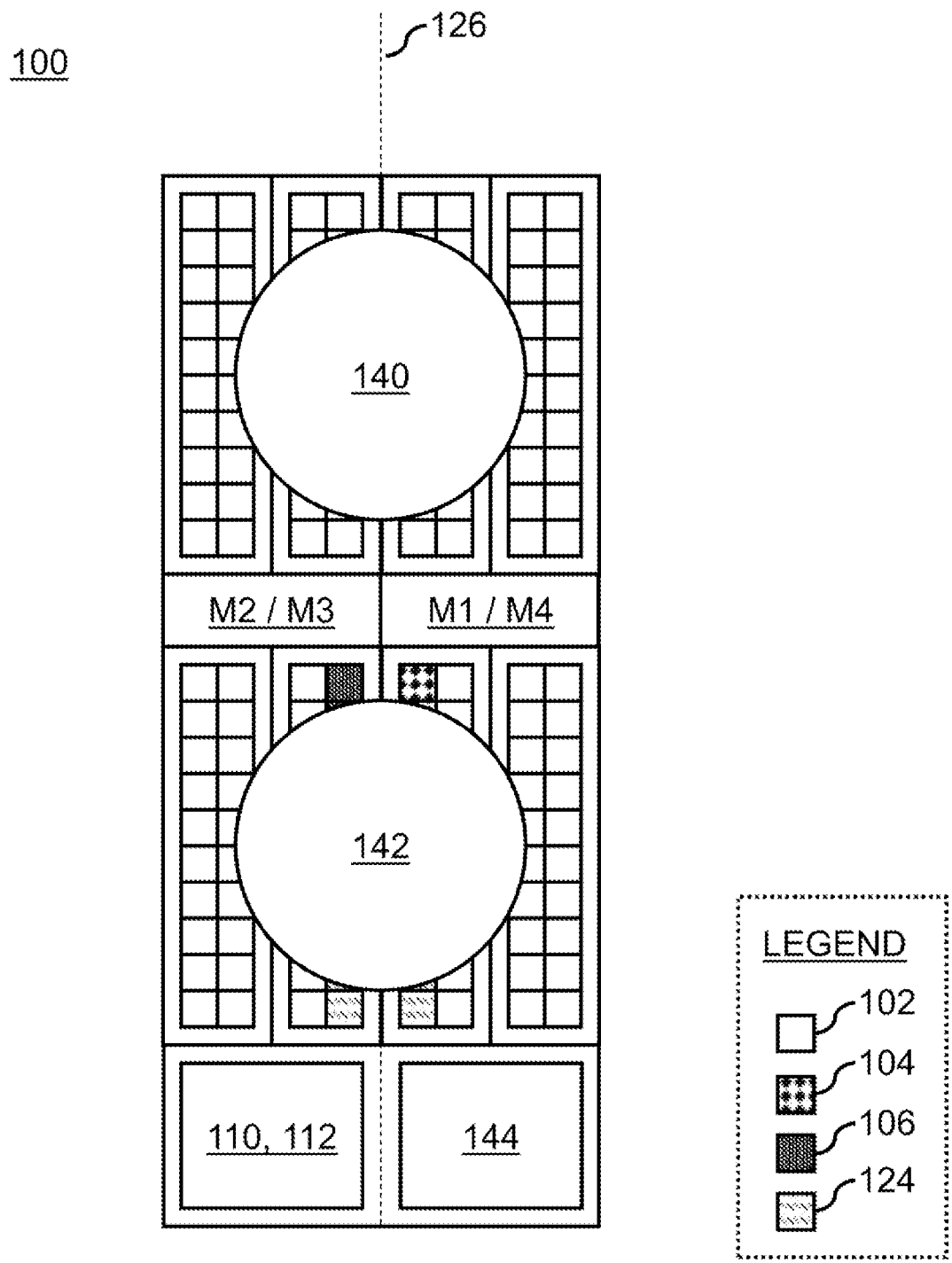
FIG. 3 depicts a top view of a layout of components of a current sense circuit, in accordance with one or more embodiments of the present disclosure.

Referring now to FIG. 3, the layout of the current sense circuit 100 is further described, in accordance with one or more embodiments of the present disclosure. The current sense circuit 100 may additionally include a resistor 110 and a resistor 112. The resistor 110 and the resistor 112 may be connected to the output of the amplifier, such that the resistor 110 and the resistor 112 may also be referred to herein as downstairs resistors. The resistor 110 and the resistor 112 may each include a resistance (Rb), such that the resistor 110 and the resistor 112 may also be referred to as a pair of matched resistors. For example, the resistance (Rb) may be 17.5 kilo-ohm (e.g., 17.5 kΩ resistor), although this is not intended to be limiting.

Although not depicted, the resistor 110 and the resistor 112 may each include a number of the array elements which are arranged formed of polysilicon sheets and arranged to form the resistance (Rb). The array elements may be arranged in a checkerboard pattern in order to improve the matching. As depicted, the resistor 110 and the resistor 112 are laid out in a symmetric matrix.

The current sense circuit 100 may further include one or more of a package pin 140 and a package pin 142. The package pin 140 and the package pin 140 may be centrally disposed about the axis 126 to reduce stress gradients for the array elements disposed below, thereby improving matching between the resistor 104 and the resistor 106. The package pin may be provided for coupling an integrated circuit package with an external component. The package pin may also be referred to as a pin or pinout.

The current sense circuit 100 may further include one or more resistors 144 for a secondary amplifier path (e.g., an analog path), as will be described further in reference to FIGS. 5A-6. For example, the resistors 144 may include an integrated pair of 1 kΩ resistors and 17K resistors which are arranged in a checkerboard pattern.

Figure 4:
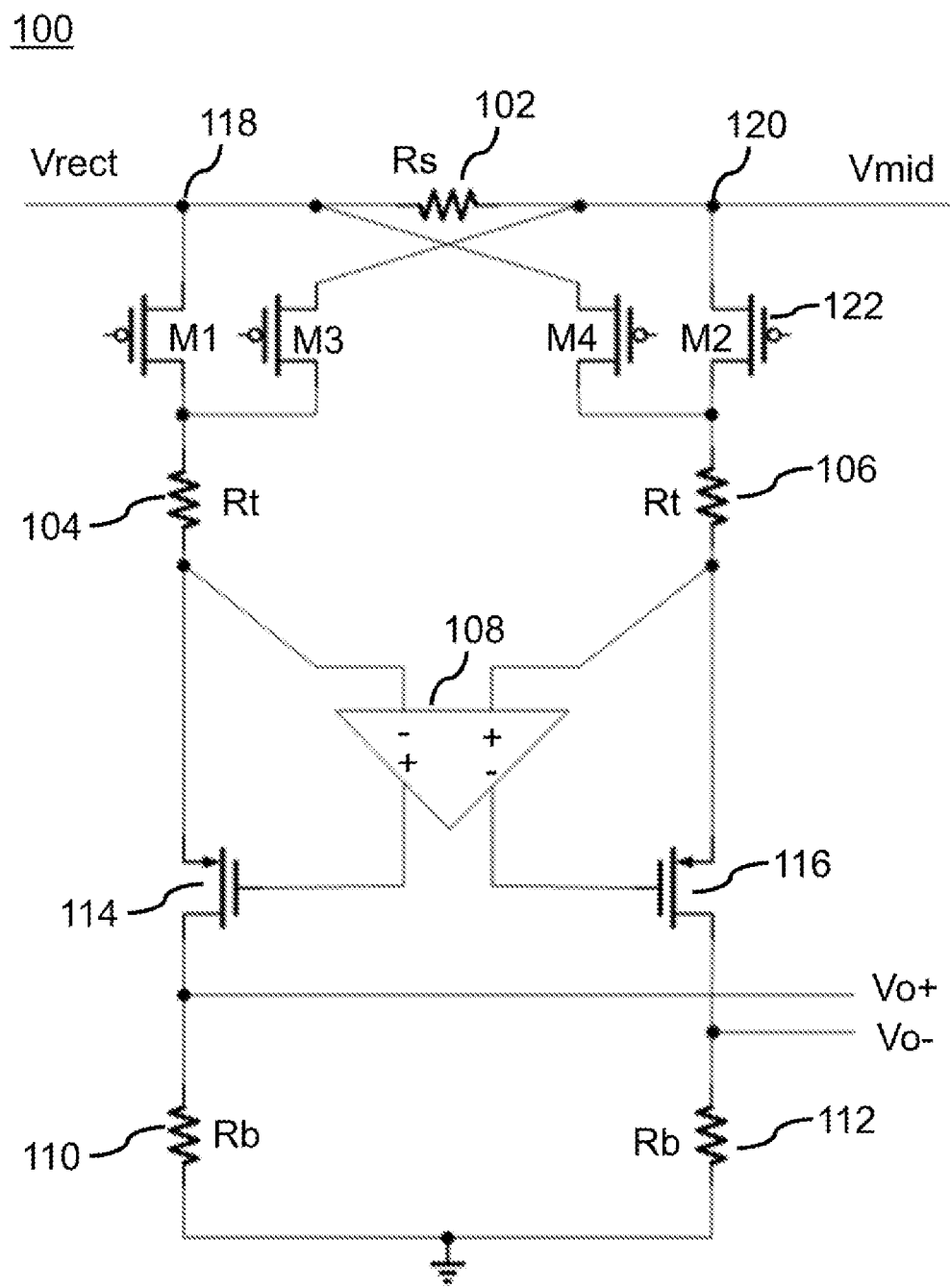
FIG. 4 depicts a circuit diagram of a current sense circuit, in accordance with one or more embodiments of the present disclosure.

Referring now to FIG. 4, a circuit diagram for the current sense circuit 100 is described, in accordance with one or more embodiments of the present disclosure. The current sense circuit 100 may provide a structure that measures a current across a resistor with a select level of accuracy and across a wide range of current values. The current sense circuit 100 may be configured to output a voltage (Vo). The voltage (Vo) may be provided to an analog-to-digital converter which generates a digital signal which is then used by a processor to determine a current (Isns). The current sense circuit 100 may include one or more components for generating the voltage (Vo). For example, the current sense circuit 100 may include the resistor 102, the resistor 104, the resistor 106, the amplifier 108, the resistor 110, the resistor 112, the transistor 114, and the transistor 116. The current sense circuit 100 may additionally include one or more switches 122 (i.e., switch (M1), switch (M2), switch (M3), and switch (M4)).

The resistor 102 may be coupled between a node with a first voltage (Vrect) and a node with a voltage (Vmid). Node may refer to a point connecting between one or more elements of a circuit and/or between one or more branches of a circuit. The node may be represented by a wire connecting the various elements and/or branches. The resistor 102 may include a resistance (Rs). The resistance (Rs) may include a relatively small resistance value. The resistance (Rs) may be relatively small to reduce the amount of power dissipated across the resistor 102, due to the inversely proportional relationship between resistance and power loss. For example, the resistor 102 may be a 20 milli-Ohm resistor, although this is not intended to be limiting. The resistor 102 may be configured to carry the current (Isns) across the resistor which is based on the resistance (Rs) and a voltage differential between the voltage (Vrect) and the voltage (Vmid). Providing the low resistance resistor makes for challenges in circuit designs, particularly with reductions in the resistance (Rs) and when measuring currents across a wide and dynamic range (e.g., between the milli-amp range to a 2.5-amp range). A number of challenges exist for integrating the resistor 102 into the integrated circuit (IC).

In embodiments, the current sense circuit 100 is designed to output the voltage (Vo) for sensing the current (Isns). In this regard, the ability to detect the current (Isns) may be advantageous for sensing a received or transmitted power. Due to the desire to detect the current (Isns) across the resistor 102, the resistor 102 may also be referred to as a sense resistor.

The resistor 104 may be coupled between the node having the voltage (Vrect) and an input of the amplifier 108. Similarly, the resistor 106 may be coupled between the node having the voltage (Vmid) and an input of the amplifier 108. In this regard, the resistor 104 and the resistor 106 may also be referred to herein as upstairs resistors or input resistors for the amplifier 108. In embodiments, the resistor 104 and the resistor 106 each include a resistance value (Rt) which is matched. In this regard, the resistor 104 and the resistor 106 may also be referred to herein as a pair of matched resistors. The resistance (Rt) may increase with aging of the resistor 104 and the resistor 106.

The resistor 110 may be coupled between an output of the amplifier 108 and a ground. Similarly, the resistor 112 may be coupled between an output of the amplifier 108 and a ground. For example, the resistor 110 is depicted as being coupled between a node of the transistor 114 and ground, and the resistor 112 is depicted as being coupled between a node of the transistor 116 and ground. In this regard, the resistor 110 and the resistor 112 may also be referred to herein as downstairs resistors for the amplifier 108. In embodiments, the resistor 110 and the resistor 112 each include a resistance value (Rb) which is matched. In this regard, the resistor 110 and the resistor 112 may also be referred to herein as a pair of matched resistors. By the arrangement of the resistor 110 and the resistor 112, the voltage (Vo) output from the current sense circuit 100 is proportional to the resistance (Rb).

The amplifier 108 may be configured to output the voltage (Vo). The amplifier 108 may output the voltage (Vo) by amplifying a voltage drop across the resistor 102. The voltage (Vo) may thus be based on the current (Isns). The amplifier 108 may also be referred to as an operational amplifier, a differential amplifier, or a high gain amplifier. The amplifier 108 may sense the input voltage on the upstairs resistors and drive the outputs so that the voltage from the side and the right side is equal. Providing an equal voltage on the left and right side may provide a current that is proportional to the current (Isns). The amplifier 108 may include a gain which is based on the resistance (Rb) for the downstairs resistors divided by the resistance (Rt) the upstairs resistors. For example, the resistance (Rt) for the upstairs resistors may be 1 kilo-ohm (1 kΩ resistor), although this is not intended to be limiting. Continuing the example, the resistance (Rb) for the downstairs resistors may be 17.5 kilo-ohms (17.5 kΩ resistor), although this is not intended to be limiting. Where the upstairs resistors are 1 kΩ resistors and the downstairs resistors are 17.5 kΩ resistors, the gain of the amplifier may be a factor of 17.5 (e.g., a gain of approximately 24.86 dB), although this is not intended to be limiting. In some instances, the gain for the amplifier 108 may be selected based on a capability of a downstream ADC.

In embodiments, each of the resistor 102, the resistor 104, the resistor 106, the resistor 110, and the resistor 112 are included within the integrated circuit 700, such that the resistors may be considered "internal". Each of the resistors may be formed of one or more polysilicon elements which define the resistance value (Rs), the resistance value (Rt), and the resistance value (Rb). It is further contemplated that the resistor 102, the resistor 104, and the resistor 106 may include a substantially similar temperature coefficient and a similar aging coefficient.

In embodiments, the resistor 102 is an internal resistor. The current sense circuit may sense the current internally without using an external component, such as an external sense resistor. The resistor 102 being part of the integrated circuit, including a relatively low resistance value, and measuring a large dynamic range of currents may provide challenges with designing the current sense circuit 100. In embodiments, the resistor 102 is a precision resistor which is provided within the integrated circuit on the chip and is combined with the amplifier 108 to form the current sense circuit 100. The current measured across the resistor 102 may be referred to herein as sensed current (Isns) and may be based on the resistance value of the sense resistor (Rs) and the voltage drop between the rectified voltage (Vrect) and the middle voltage (Vmid).

The current sense circuit 100 includes a node 118 between the resistor 102 and the resistor 104. The node 118 may be provided for routing the voltage (Vrect) to and from a rectifier, although this is not intended to be limiting. The current sense circuit 100 may also include a node 120 between the resistor 102 and the resistor 104. The node 120 may be provided for routing the voltage (Vmid) to and from a voltage regulator, although this is not intended to be limiting.

In embodiments, the resistor 102 is assembled into an integrated circuit with the amplifier 108. The upstairs resistors (e.g., the resistor 104, the resistor 106) and the downstairs resistors (e.g., the resistor 110, the resistor 112) may also be part of the integrated circuit. By merging the amplifier components with the resistor 102 onto the integrated circuit, the temperature coefficient of the resistor 102 and the upstairs resistors may be substantially similar. In embodiments, an integrated circuit includes the upstairs resistors and the current sense resistors which are integrated into the layout.

In embodiments, one or more of the resistor 102, the resistor 104, the resistor 106, the resistor 110, or the resistor 112 comprises a polysilicon resistor formed onto the integrated circuit below a metallization layer. The polysilicon resistor may also be referred to herein as a poly resistor, an internal poly resistor. In embodiments, the polysilicon resistor is formed as an array of polysilicon elements. The polysilicon elements may also be referred to herein as polysilicon sheets. The polysilicon elements may comprise any polysilicon material known in the art. The polysilicon material may include a resistance which changes with temperature. The use of the polysilicon material may be advantageous for reducing the temperature coefficient, as compared to implementing the resistors in metallization layers of the integrated circuit.

The polysilicon elements may include a wide range of dimensions. For example, the polysilicon elements used to form the resistor 102, the resistor 104, or the resistor 106 may be relatively wide. For instance, the polysilicon elements may be 50 microns wide. The polysilicon elements may further include a length, such as, but not limited to, 4 microns long. The aspect ratio of the polysilicon elements may thus be 50 microns by 4 microns. The polysilicon elements with an aspect ratio of 50 microns by 4 microns have been experimentally determined to include a temperature coefficient of 150 PPM/C. By way of another example, the polysilicon elements used to form the resistor 110 or the resistor 112 may be relatively narrow when compared to the polysilicon elements of the upstairs resistors and the sense resistor. For instance, the polysilicon elements of the downstairs resistors may be 1 micron wide. The polysilicon elements of the downstairs resistors may change over time due to aging. In embodiments, a variation in resistance of the downstairs resistance is further calibrated for by a calibration circuit (not depicted).

One challenge with implementing the resistor 102 within the integrated circuit is a temperature coefficient of the resistor 102. Integrating the upstairs resistors into the array of the resistor 102 may allow for cancellation of the temperature coefficient for the resistance (Rs) and the resistance (Rt). Cancelling the temperature coefficient may remove inaccuracies associated with the temperature of the upstairs resistor and the current sense resistor. The voltage (Vo) may be proportional to the current (Isns), the resistance (Rs), and the resistance (Rb). The voltage (Vo) may further be inversely proportional to the resistance (Rt).

The transistor 114 and the transistor 116 may act as a gain stage from the amplifier. For example, if the amplifier 108 starts to detect a different in voltage on the inputs, the output from the amplifier may pull up or pull down the gate of transistor 114 and the transistor 116, causing the transistors 126 and the transistor 116 to act as current sources. As may be understood, the transistor 114 and the transistor 116 may generally include any transistor, such as, but not limited to, a field-effect transistor such as a metal-oxide-semiconductor field-effect transistor (MOSFET or M). As depicted, the transistor 114 and the transistor 116 may be a N-channel MOS (NMOS), although this is not intended to be limiting.

The current sense circuit 100 may also include a switch matrix. The switch matrix may include one or more switches 122, such as, but not limited to, a switch (M1), a switch (M2), a switch (M3), and a switch (M4). The switches (M1-M4) may be selectively opened and closed for configuring the current sense circuit in a receive mode, a transmit mode, and one or more offset calibration modes. The switching matrix may allow for transmit and receive inversion in gain. The switching matrix may also allow measurement of an offset of the input voltages to the amplifier. Advantageously, the current sensing circuit 100 includes current sense accuracy to within 0.5 percent of an actual current across the resistor 102. The switch matrix may provide direct offset measurement with minimal introduction of parasitics that can impact temperature performance.

The switches (M1-M4) may be arranged between the resistor 102, the resistor 104, and the resistor 106. The switch (M1) is coupled between the node 118 and the resistor 104. The switch (M2) is coupled between the node 120 and the resistor 106. The switch (M3) is coupled between the node 120 and the resistor 104. The switch (M4) is coupled between the node 118 and the resistor 106.

The switches (M1-M4) allow for measuring current transfer from node 118 with voltage (Vrect) into node 120 with voltage (Vmid), measuring current transfer from voltage (Vmid) into voltage (Vrect), and measuring offset of the current sense circuit. The processor may receive one or more digital signals of the voltage (Vo) and determine the current (Isns) based on the voltage (Vo). The voltage (Vo) may also indicate the offset contributed by the resistor 104, the resistor 106, the resistor 110, the resistor 112, and the amplifier 108, depending upon which of the switches (M1-M4) are closed.

The current sense circuit 100 is configured in a receive mode when the switch (M1) and the switch (M2) are closed and the switch (M3) and the switch (M4) are open. The processor may measure the current transfer from voltage (Vrect) into voltage (Vmid) in the receive mode. In the receive mode, the current sense circuit may measure current received by an integrated circuit of a wireless power system. For example, the receive mode may correspond to communications and/or wireless power received from a transmitter. The wireless power system may thus be configured in the receive mode based on the configuration of the switches.

The current sense circuit 100 is configured in a transmit mode when the switch (M3) and the switch (M4) are closed and the switch (M1) and the switch (M2) are open. The processor may measure the current going from voltage (Vmid) into voltage (Vrect) in the transmit mode. In this regard, the switches (M1-M4) provide a way to invert the between transmit (Tx) and receive (Rx). In the transmit mode, the current sense circuit may measure current transmitted from an integrated circuit of a wireless power system. For example, the transmit mode may correspond to communications transmitted from the wireless power system. The wireless power system may thus be configured in the transmit mode based on the configuration of the switches.

The current sense circuit 100 is configured in a first offset mode to measure the offset of current sense circuit 100 when the switch (M1) and the switch (M4) are closed and the switch (M2) and the third switch (M3) are open. When the switch (M1) and the switch (M4) are turned on, the input of the current sense circuit 100 may be shorted at node 118. The processor may be configured to measure the offset of the current sense circuit 100 (e.g., the offset of the various resistors and the amplifier together) based on the one or more digital signals of the voltage (Vo) when the switch (M1) and the switch (M4) are closed and the switch (M2) and the switch (M3) are open.

Alternatively, the current sense circuit 100 is configured in a second offset mode to measure the offset of the current sense circuit 100 when the switch (M2) and the switch (M3) are closed and the switch (M1) and the switch (M4) are open. When the switches M2 and M3 are turned on, the input of the current sense circuit 100 may be shorted at node 120. The processor may be configured to measure the offset of the current sense circuit 100 based on the one or more digital signals of the voltage (Vo) when the switch (M2) and the switch (M3) are closed and the switch (M1) and the switch (M4) are open.

The processor may then use the offset for calibration of the measured current (Isns). For example, whatever voltage is received from the ADC while in offset mode is a zero current reference. The zero current reference may be subtracted from the voltage during the calibration phase. By implementing switches in the upstairs resistor array, the current sense circuit 100 may have both transmit and receive power modes and also perform a direct offset measurement of the resistor structures. Thus, the processor measures the offset for current sense circuit 100 based on the voltage (Vo) and then compensate for the offset when determining the current (Isns).

The switches (M1-M4) may be controlled by one or more processors executing program instructions. The processor may include firmware which causes the processor to control switches (M1-M4). The firmware may cause the processor to control the switches to make an offset measurement for the current offset. The firmware may make the offset measurement to detect what the current offset is for the structure and then use that offset information for calibration purposes.

As may be understood, the switches (M1-M4) may generally include any switch such as a transistor. The transistor may include, but is not limited to, a field-effect transistor such as a metal-oxide-semiconductor field-effect transistor (MOSFET or M). As depicted, the switches (M1-M4) may be a P-channel MOS (PMOS), although this is not intended to be limiting.

Figure 5A:
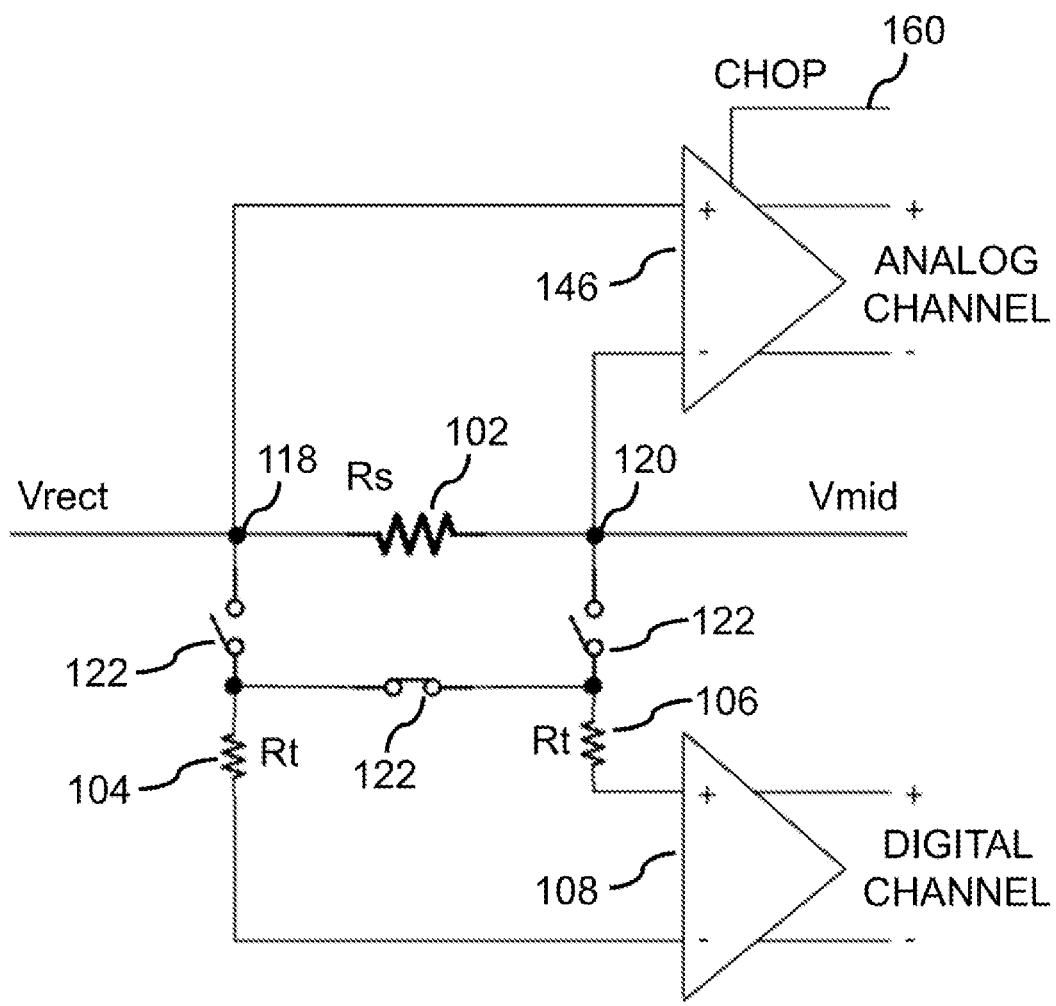
FIGS. 5A-5B depicts a circuit diagram of a current sense circuit, in accordance with one or more embodiments of the present disclosure.
Figure 5B:
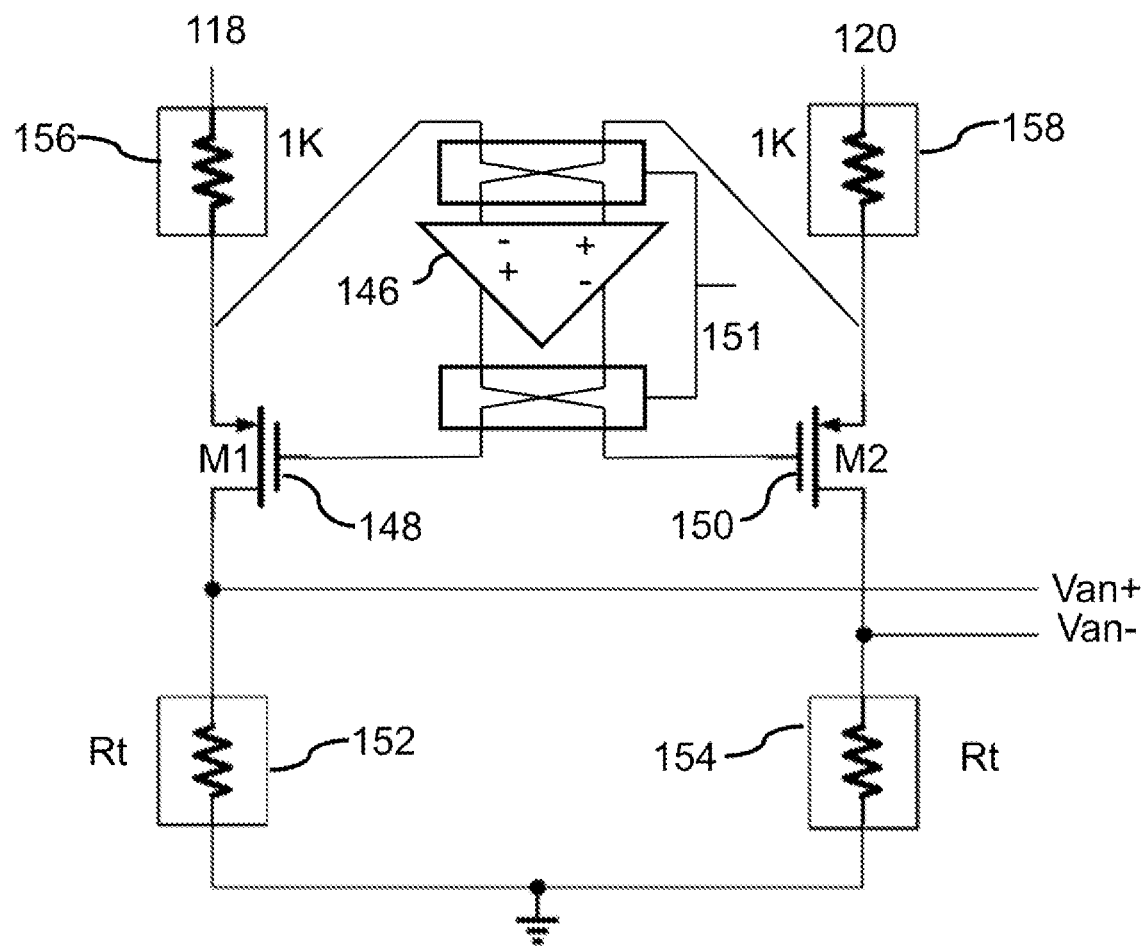

Referring now to FIGS. 5A-5B, the current sense circuit 100 is described, in accordance with one or more embodiments of the present disclosure. In embodiments, the current sense circuit 100 includes one or more channels. The current sense circuit 100 may include a digital channel and an analog channel. The current sense circuit 100 may include the amplifier 108 for the digital channel which is in parallel with an amplifier 146 for the analog channel. The amplifier 108 and the amplifier 146 may each include inputs which are coupled to the node 118 and the node 120.

The digital channel may provide one or more digital control loops using the first current (Isns). The digital channel may output the voltage (Vo) from the amplifier 108 to an ADC. The ADC may then provide one or more digital signals of the voltage (Vo) to the processor. The processor may be configured to receive one or more digital signals of the third voltage (Vo) and further be configured to determine the current (Isns) based on the voltage (Vo). The processor may also measure an offset for the current sense circuit contributed by the resistor 104, the resistor 106, the resistor 110, the resistor 112, and the amplifier 108 by switching one or more switches 122. The processor may then compensate for the offset when determining the current (Isns) for one or more digital control loops. When the processor switches the switches 122, the digital channel may be taken offline such that the processor does not determine the current (Isns) when the one or more switches 122 are switched to determine the offset. Undesirably, the loss of the current (Isns) measurement may lead to periods in which the current (Isns) may not be measured. However, providing the offset measurement may be desirable to improve accuracy of the current (Isns) measurement for the digital control loops.

The analog channel may provide one or more analog control loops using the first current (Isns). The analog channel may output a voltage (Van) from the amplifier 146 to one more circuits. The circuits may use the current (Isns) in one or more analog control loops for wireless power control. For example, the analog control loops of the integrated circuit may include, but are not limited to, a load modulation circuit (ILOAD), a main voltage regulator (MVR), and the like. The voltage regulator may regulate a voltage output of the integrated circuit. Regulating the voltage output may be beneficial in allowing a battery charging system to charge a battery. The voltage regulator circuit may generally include any circuit for regulating the voltage based on the analog control loop.

By providing the analog channel and the digital channel, the amplifier 146 may remain on when the node 118 includes the voltage (Vrect) and the node 120 includes the voltage (Vmid), thereby ensuring the analog channel continually receives the current (Isns). The amplifier 146 may remain on regardless of the state of the switches 122, such that the switches may be switched to determine the offset without impacting the analog control loops. The analog channel may thus operate independently from the digital channel thereby allowing calibration of the digital channel while analog control loops are in operation. In this regard, the amplifier 108 may also be referred to herein as a switched amplifier and the amplifier 146 may also be referred to herein as an always-on amplifier.

The current sense circuit 100 may additionally include any number of elements coupled to the amplifier 146. Although not depicted, the current sense circuit 100 may include one or more resistors which are coupled between the node 118 or the node 120 and the input of the amplifier 146 (see resistor 104, resistor 106, for example). The current sense circuit 100 may include one or more elements which are coupled to the output of the amplifier 146. For example, the current sense circuit 100 may include a transistor 148, a transistor 150, a resistor 152, and a resistor 154. The transistor 148 and the transistor 150 may each be coupled to an output of the amplifier 146. The voltage (Van) may thus be based on the input voltages of the amplifier 146 and one or more resistances of the analog channel. For example, the amplifier 146 may be a differential amplifier with a gain set based on the resistance of the input and the output.

The transistor 148 and the transistor 150 may generally include any transistor, such as, but not limited to, a field-effect transistor such as a metal-oxide-semiconductor field-effect transistor (MOSFET or M). As depicted, the transistor 148 and the transistor 150 may be a P-channel MOS (PMOS), although this is not intended to be limiting.

The resistor 152 may be coupled between the transistor 148 and ground. Similarly, the resistor 154 may be coupled between the transistor 150 and ground. The resistor 152 and the resistor 154 may each include a resistance (Rt). For example, the resistor 152 and the resistor 154 may each include a resistance of 17 kilo-ohm (17 kΩ), although this is not intended to be limiting. The resistor 152 and the resistor 154 may also be referred to as a pair of matched downstairs resistors.

The current sense circuit 100 may include one or more elements coupled between the output and the input of the amplifier 146. The one or more elements may include a resistor 156 and a resistor 158. The resistor 156 and the resistor 158 may each include a matched resistance value. For example, the resistor 156 and the resistor 158 may each include a resistance of 1 kilo-ohm (1 kΩ), although this is not intended to be limiting. The resistor 156 may be coupled between the transistor 148 and a first input of the amplifier 146. Similarly, the resistor 158 may be coupled between the transistor 150 and a second input of the amplifier 148.

The current sense circuit 100 may include one or more offset correction features. For example, the amplifier 146 may include chop switches 151. The chop switches 151 may also be referred to as chop clock feedback or the like. The chop feedback loop may provide chop for offset correction of amplifier 146. The offset correction of the amplifier 146 may improve an accuracy of the analog channel. For example, the chop feedback loop may include a first chop switch at the inputs of the amplifier 146. The first chop switch may be configured to switch the inputs of the amplifier. By way of another example, the chop feedback loop may include a second chop switch at the outputs of the amplifier 146. The second chop switch may be configured to switch the outputs of the amplifier.

As may be understood, the depiction of the switches 122 is not intended to be limiting. For example, the current sense circuit 100 may include any number of the switches for measuring the offset, such as but not limited to, the four-switch configuration of FIG. 4 or the three-switch configuration of FIG. 5A.

Figure 6:
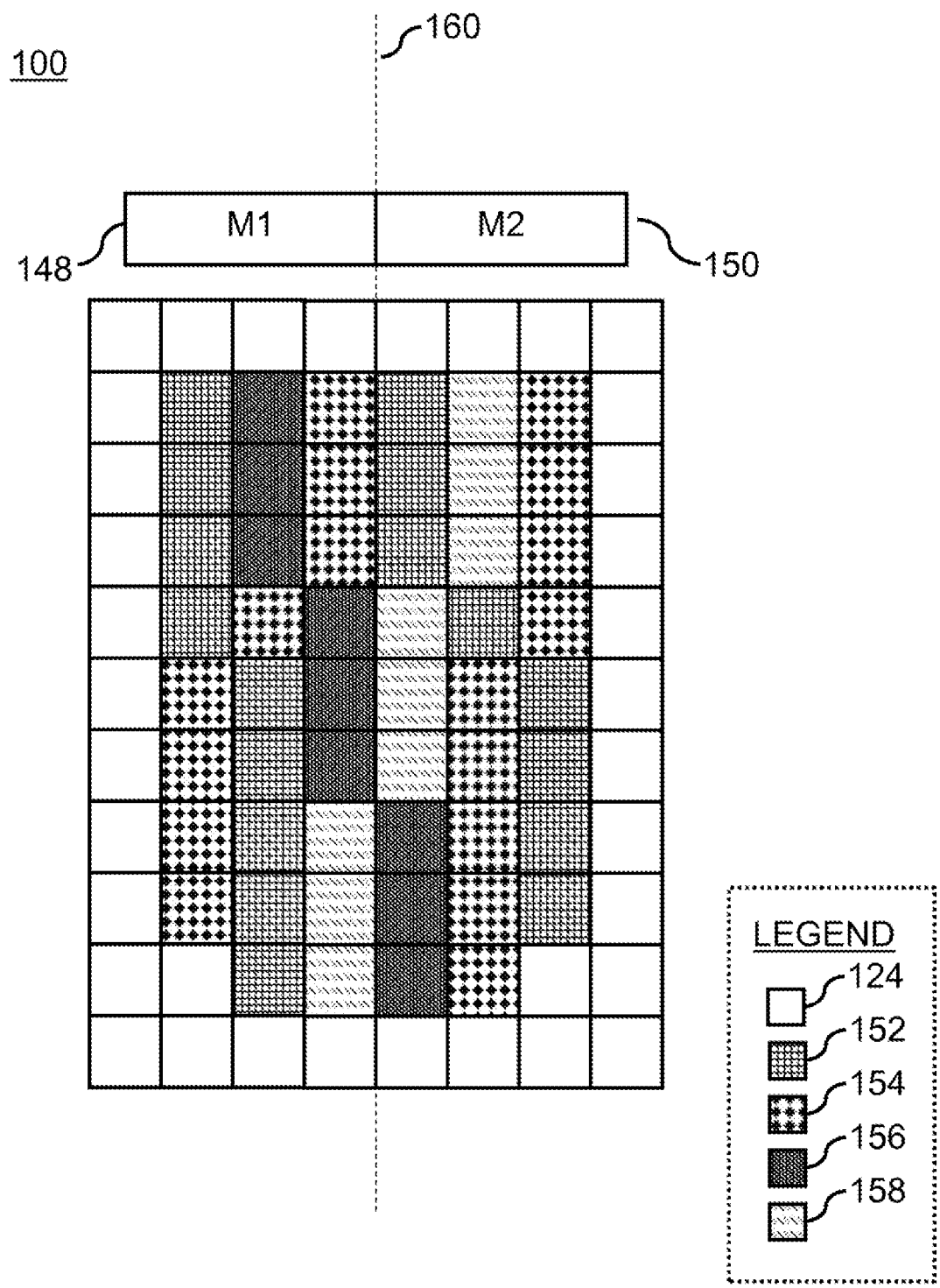
FIG. 6 depicts a top view of a layout of components of a current sense circuit, in accordance with one or more embodiments of the present disclosure.

Referring now to FIG. 6, a layout of one or more components of the current sense circuit 100 are described, in accordance with one or more embodiments of the present disclosure. As depicted, the dummy resistor 124, the resistor 152, the resistor 154, the resistor 156, and the resistor 158 are depicted with different hatching which is not intended to be limiting. Rather, the resistors are depicted with the hatching to illustrate the number of the array elements included with each resistor. It is contemplated that the layout of the resistor 152, the resistor 154, the resistor 156, and the resistor 158 may be advantageous for any number of current sense circuit which sense current over a milliamp to amp range.

In embodiments, the resistor 152, the resistor 154, and the resistor 156 each include a polysilicon resistor formed onto a substrate. The polysilicon resistor may also be referred to herein as a poly resistor or an internal poly resistor. In embodiments, the polysilicon resistor is formed as an array of the array elements each including the polysilicon sheets. The polysilicon sheets may be disposed on a layer of the integrated circuit. As depicted, the resistor 152 and the resistor 154 each include 17 of the array elements. Similarly, the resistor 156 and the resistor 158 are each depicted as including 9 of the array elements. Furthermore, although not depicted, the array elements for each of the resistors may be coupled in any number of series or parallel arrangements to achieve a desired resistance value. Each array element may include a number of polysilicon sheets. The discussion of the polysilicon sheets of FIGS. 1A-2B is incorporated herein by reference. In this regard, the array elements may be formed from any number of the polysilicon sheets with any aperture, resistivity, and temperature coefficient.

It may be desirable to ensure that the resistor 152 and the resistor 154 have as closed to a matched resistance value as possible, such as to ensure appropriate gain for one or more amplifiers of the current sense circuit. In embodiments, the resistor 152 and the resistor 154 include array elements with the polysilicon sheets which are symmetrically arranged about an axis 160. Similarly, the resistor 156 and the resistor 158 include array elements with the polysilicon sheets which are symmetrically arranged about an axis 160. In this regard, the stress differential between the polysilicon sheets may be reduced. Reducing the stress differential may cause the matched pair of resistors to experience a similar stress. Experiencing the similar stress may cause the resistor to experience a similar change in resistance due to piezo resistivity. The polysilicon sheets for the resistor 152 may be interdigitated with the resistor 154. Similarly, the polysilicon sheets for the resistor 156 may be interdigitated with the resistor 158. As depicted, the polysilicon sheets for the resistor 152 are mirrored to the resistor 154 across the axis 160. Additionally, the sheets for the resistor 156 are mirrored to the resistor 158 across the axis 160. Such arrangement may also be referred to as a checkerboard pattern, although this is not intended to be limiting.

Figure 7:
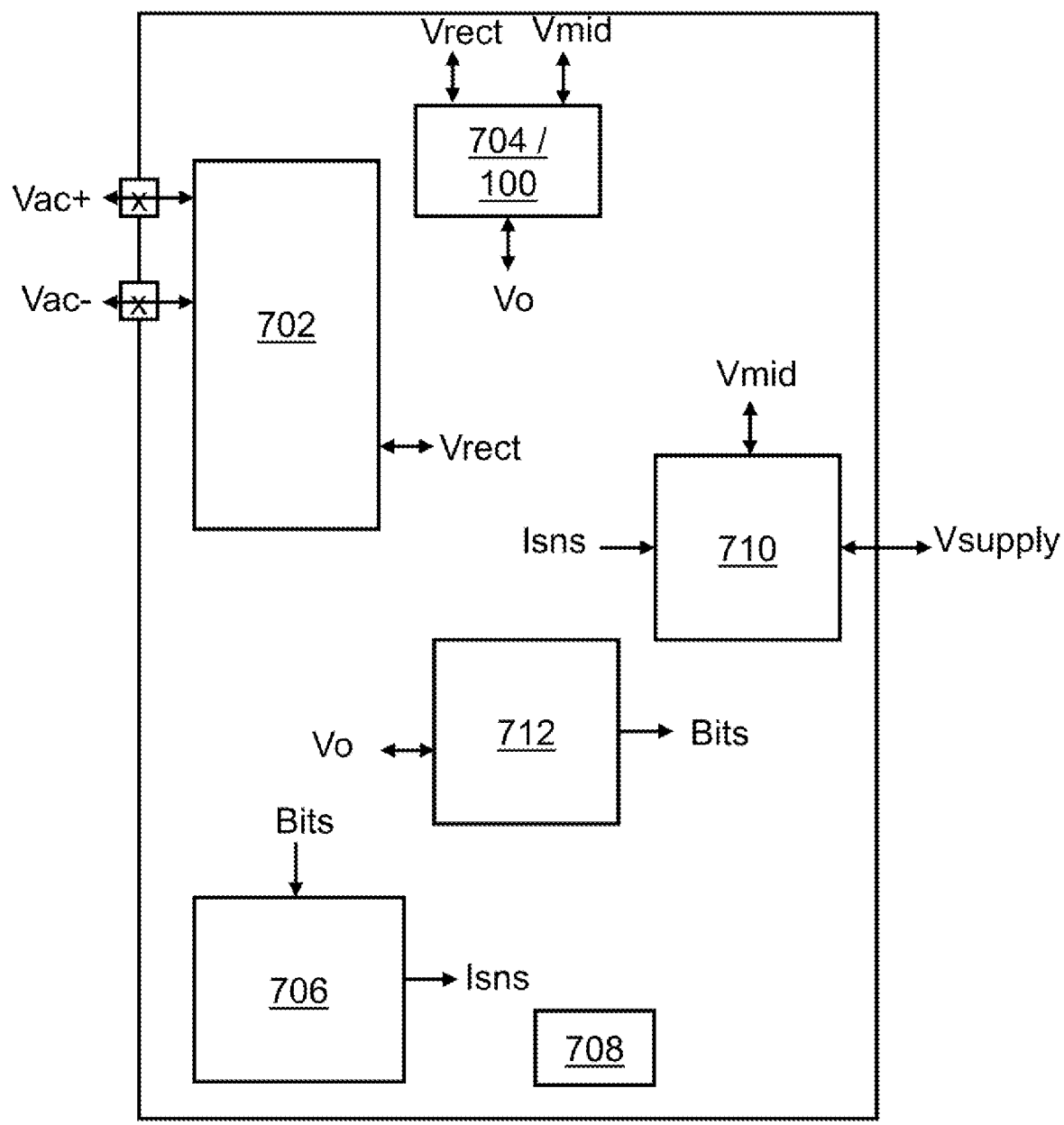
FIG. 7 depicts a simplified block diagram of an integrated circuit including a current sense circuit, in accordance with one or more embodiments of the present disclosure.

Referring now to FIG. 7, one exemplary embodiment of an integrated circuit 700 is described, in accordance with one or more embodiments of the present disclosure. The integrated circuit 700 may also be referred to herein as a transceiver unit, a mixed-signal chip, a wireless power chip, a wireless power receiver (Rx), a receiver (Rx) integrated circuit, or the like. The integrated circuit 700 may be configured to receive and condition alternating current and output a regulated DC voltage. For example, the alternating current may be received from a coil of a wireless power system and the regulated DC voltage may be provided to a battery for charging the battery, although this is not intended to be limiting. In embodiments, the integrated circuit 700 may include one or more of a rectifier 702, a current sense circuit 704 (e.g., the current sense circuit 100), a processor 706, a power unit 708, a voltage regulator 710, an analog-to-digital converter 712, and the like. It is further contemplated that the integrated circuit 700 may include any number of additional components which are not depicted herein in the interest of clarity. For example, the integrated circuit 700 may further include various traces between one or more of the rectifier 702, the current sense circuit 704, the embedded processor 706, the power unit 708, the voltage regulator 710, and the analog-to-digital converter 712 which are not depicted.

The rectifier 702 may be configured to receive an alternating current having a voltage (Vin). For example, the alternative current may be received from a coil of a wireless power system, although this is not intended to be limiting. The rectifier 702 may be further configured to generate a direct current having a voltage (Vrect). The voltage (Vrect) may be unregulated to a desired supply power. The rectifier 702 may generally include any suitable circuit for rectifying the current. For example, the rectifier 702 may include a bridge circuit, such as, an H-bridge circuit.

The rectifier 702 may convert an AC input voltage to a rectified DC voltage when the integrated circuit is configured in a receive mode. The rectifier may also convert a DC input voltage to an AC output voltage when the integrated circuit is configured in a transmit mode. For example, the integrated circuit may be configured in the receive mode for receiving wireless power. By way of another example the integrated circuit may be configured in the receive mode and/or the transmit mode for wireless communication with a transmitter.

The discussion of the current sense circuit 100 is incorporated herein by reference as to the current sense circuit 704. The current sense circuit 704 may include a voltage (Vrect) from a node and a voltage (Vmid) from a node. The voltage (Vrect) may be higher or lower than the voltage (Vmid) depending upon whether the integrated circuit 700 is receiving or transmitting. The current sense circuit 704 may further output a voltage (Vo) which may be used to determine the current (Isns).

The processor 706 may generally include any suitable processor. For example, the embedded processor 706 may be a microprocessor, although this is not intended to be limiting. The processor 706 may further include one or more blocks of memory, by which the processor 706 may be configured to execute any of the various methods described herein. For example, the processor 706 may include, but is not limited to, a read-only memory (ROM) for performing boot operations, one-time programmable (OTP) memory for start-up code, and/or random-access memory (e.g., static RAM) for maintaining program instructions, communications (e.g., FSK communications, ASK communications, etc.), and the like.

The processor 706 may generally be configured to execute various program functions which may be maintained in firmware. For example, the processor 706 may be configured to receive various bits from the analog-to-digital converter 712. The processor 706 may further be configured to determine a current (Isns) across the current sense circuit 704.

The power unit 708 may be configured to power various components of the integrated circuit, such as, but not limited to, the embedded processor 706 or another component of the integrated circuit 700. The power unit 708 may generally provide any level of power, such as, but not limited to, 1.2 volts, 1.8 volts, 3.3 volts or 5 volts. The power unit 708 may draw power from any number of sources, such as, but not limited to, a main power rail of a communication device.

The voltage regulator 710 may be configured receive the voltage (Vmid) from the current sense circuit 704. The voltage regulator 710 may further be configured to regulate the voltage to a desired output. The regulated voltage may then be provided to a battery or a battery charging system for charging the battery. The regulated voltage may generally include any suitable output voltage for wireless charging, such as, but not limited to, 15 volts or 30 volts.

The analog-to-digital converter 712 may be configured to receive various voltage and/or currents from any one or more of the components of the integrated circuit and generate a digital signal of bits. For example, the analog-to-digital converter 712 may receive the voltage (Vo) from the current sense circuit 704 and generate the digital signal based on the voltage (Vo). The analog-to-digital converter 712 may then provide the digital signal to the processor 706 for processing. As may be understood, the analog-to-digital converter 712 may generally include any analog-to-digital converter (ADC), and may further include multiple for handling various other converter various other signals, which are not depicted herein.

Although the current sense circuit 704 is described as being a component of the integrated circuit 700, this is not intended as a limitation of the present disclosure. It is contemplated that the current sense circuit 100 and/or the current sense circuit 704 may be integrated into any number of integrated circuits. In this regard, reducing pressure variation due to piezoresistive may be advantageous in any number of integrated circuits for providing a precision current measurement over a wide dynamic range. The application may include any type of precision current measurement on a chip, whether it's from wireless power or for any type of power management type of integrated circuits.

In some instances, the integrated circuit 700 may achieve a 0.5% or better current sense accuracy, which may be an improvement from existing current sense accuracy of 1.0%. Improving the current sense accuracy may be advantageous in allowing for higher levels of power transfer while still meeting one or more safety requirements, such as, but not limited to, requirements regarding foreign object detection.

Figure 8:
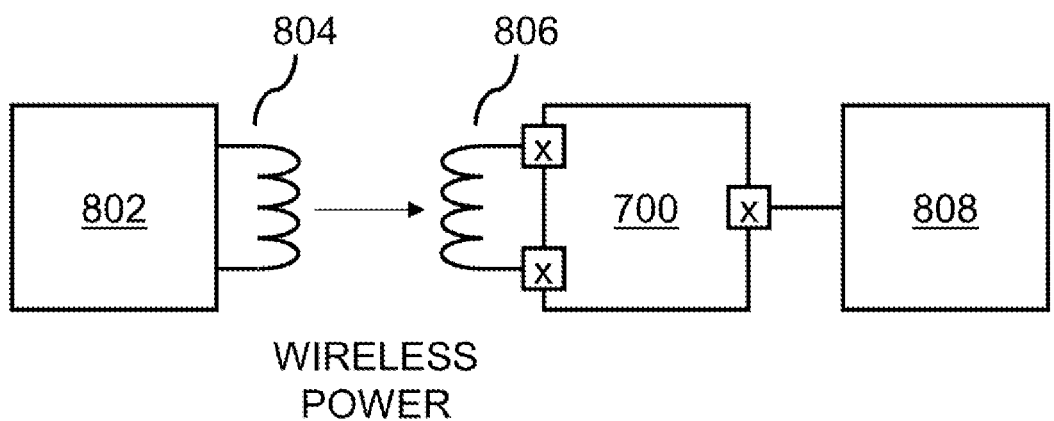
FIG. 8 depicts a simplified schematic of a wireless power system, in accordance with one or more embodiments of the present disclosure.

Referring now to FIG. 8, a wireless power system 800 is described in accordance with one or more embodiments of the present disclosure. The wireless power system 800 may include one or more components, such as, but not limited to, a transmitter unit 802, a transmitter coil 804, a receiver coil 806, the integrated circuit 700, and a battery charger 808. The transmitter unit 802 and the integrated circuit 700 may be inductively coupled by the transmitter coil 804 and the receiver coil 806. In this regard, the integrated circuit 700 may receive power wirelessly from the transmitter unit 802 and provide the power to the battery charger 808 for charging one or more batteries. The integrated circuit 700 and the transmitter unit 802 may wirelessly communicate by any number of communication protocol. For example, the integrated circuit 700 may receive transmit and receive communications to the transmitter unit 802, to establish a transmission by one or more handshake protocols. The current sense circuit may be configured to sense the current (Isns) in either transmit mode or receive mode.

Providing a high accuracy current measurement from the current sense circuit within the integrated circuit 700 is advantageous to help with foreign object detection. The more accurate the current sense, a more accurate power transfer in the system 800 may be performed. Power transfer levels for the wireless power system 800 has increased over time. Accurate current sense becomes increasingly important as the power levels increase. Sensing current internally without using external resistors within the current sense circuit is also advantageous.

Figure 9:
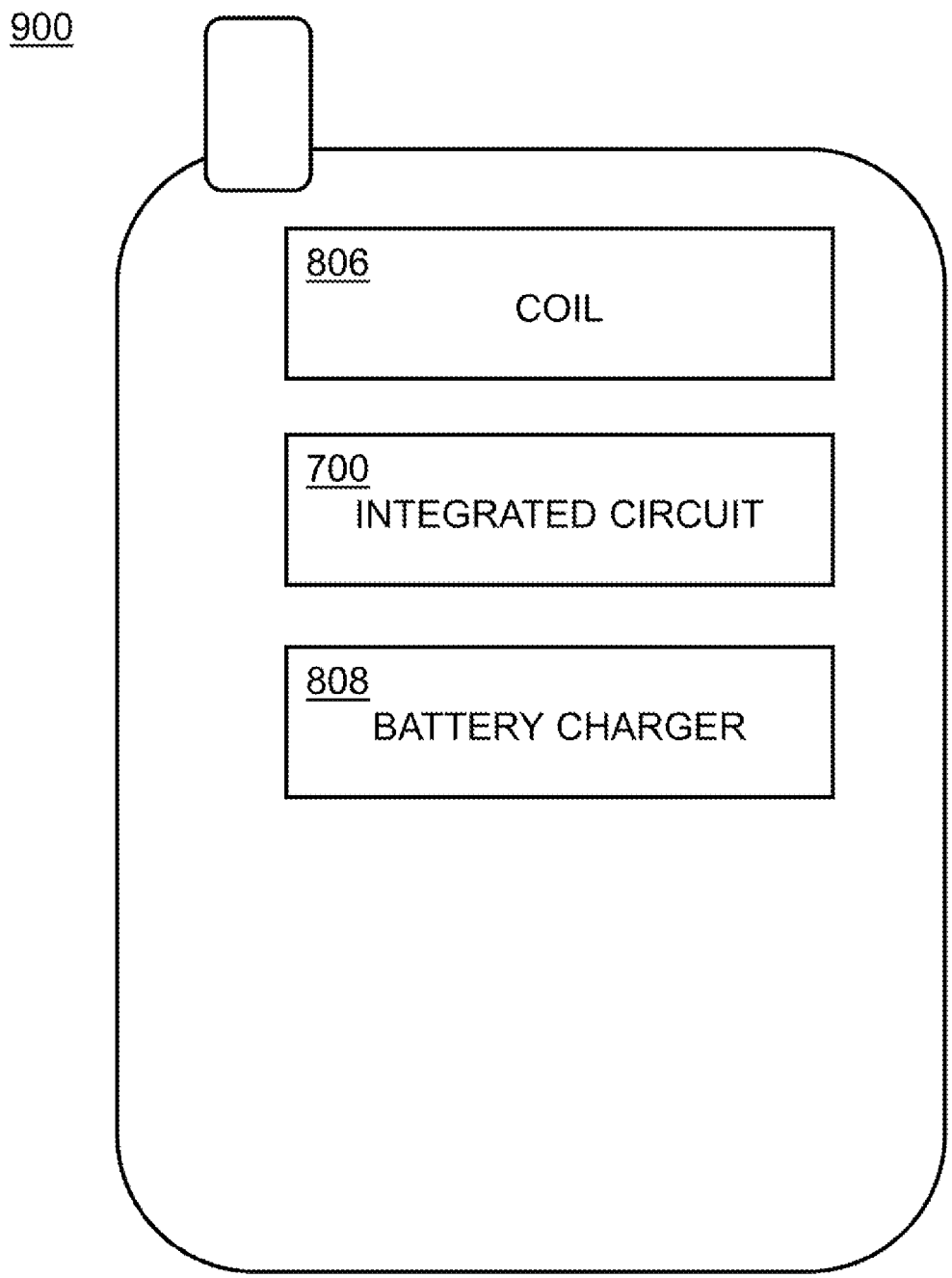
FIG. 9 depicts a simplified communication device including one or more components of a wireless power system, in accordance with one or more embodiments of the present disclosure.

Referring now to FIG. 9, a communication device 900 is described in accordance with one or more embodiments of the present disclosure. The communication device 900 may generally include one or more components of the wireless power system 800, by which the battery may be wirelessly charged. Peak wireless power transfer levels for the communication device 900 may range from 15 to 30 watts, or more, and may further increase with advances in wireless power transfer protocols and hardware. Improved accuracy in the ability to sense current within the wireless power system 800 becomes increasingly important as the peak wireless power transfer levels increase. The communication device 900 may generally include any type of device configured to communicate by transmitting or receiving a signal (e.g., digital, analog, etc.) over a medium (e.g., wired, wireless, etc.), such as, but not limited, a cellular phone, a modem, a network interface, and the like. In some instances, the communication device 900 is configured to communicate by the wireless power system, such as for communicating between a transmitter and receiver.

Referring generally again to FIGS. 1A-9, for the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). Furthermore, the memory may include any storage medium known in the art suitable for storing program instructions executable by the associated processor. For example, the memory medium may include a non-transitory memory medium. By way of another example, the memory medium may include, but is not limited to, a read-only memory (ROM), a random-access memory (RAM), a magnetic or optical memory device (e.g., disk), a solid-state drive and the like. It is further noted that memory medium may be housed in a common controller housing with the processor. In embodiments, the memory medium may be located remotely with respect to the physical location of the processor.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. An integrated circuit comprising:
    a first resistor coupled between a first node and a second node; wherein the first resistor has a first resistance (Rs); wherein the first resistor is configured to carry a first current (Isns) across the first resistor when the first node has a first voltage (Vrect) and the second node has a second voltage (Vmid);
    an amplifier configured to output a third voltage (Vo);
    a second resistor and a third resistor; wherein the second resistor and the third resistor each have a second resistance (Rt); wherein the second resistor is coupled between the first node and a first input of the amplifier; wherein the third resistor is coupled between the second node and a second input of the amplifier;

a fourth resistor and a fifth resistor; wherein the fourth resistor and the fifth resistor each have a third resistance (Rb); wherein the fourth resistor is coupled between a first output of the amplifier and ground; wherein the fifth resistor is coupled between a second output of the amplifier and ground; wherein the third voltage (Vo) is proportional to the third resistance (Rb);

a switch matrix comprising a first switch (M1) coupled between the first node and the second resistor, a second switch (M2) coupled between the second node and the third resistor, a third switch (M3) coupled between the second node and the second resistor, and a fourth switch (M4) coupled between the first node and the third resistor; and a processor configured to determine the first current (Isns) based on one or more digital signals of the third voltage (Vo); wherein the processor is configured to measure an offset by the first switch (M1), the second switch (M2), the third switch (M3), and the fourth switch (M4); wherein the processor is configured to compensate for the offset when determining the first current (Isns).

2. The integrated circuit of claim 1, wherein the integrated circuit is configured in a receive mode when the first switch (M1) and the second switch (M2) are closed and the third switch (M3) and the fourth switch (M4) are open.

3. The integrated circuit of claim 1, wherein the integrated circuit is configured in a transmit mode when the third switch (M3) and the fourth switch (M4) are closed and the first switch (M1) and the second switch (M2) are open.

4. The integrated circuit of claim 1, wherein the integrated circuit is configured to measure the offset when the first switch (M1) and the fourth switch (M4) are closed and the second switch (M2) and the third switch (M3) are open.

5. The integrated circuit of claim 4, wherein the processor is configured to measure the offset based on the one or more digital signals of the third voltage (Vo) when the first switch (M1) and the fourth switch (M4) are closed and the second switch (M2) and the third switch (M3) are open.

6. The integrated circuit of claim 1, wherein the integrated circuit is configured to measure the offset when the second switch (M2) and the third switch (M3) are closed and the first switch (M1) and the fourth switch (M4) are open.

7. The integrated circuit of claim 6, wherein the processor is configured to measure the offset based on the one or more digital signals of the third voltage (Vo) when the second switch (M2) and the third switch (M3) are closed and the first switch (M1) and the fourth switch (M4) are open.

8. The integrated circuit of claim 1, wherein the processor is configured to control the first switch (M1), the second switch (M2), the third switch (M3), and the fourth switch (M4).

9. The integrated circuit of claim 1, wherein each of the first switch (M1), the second switch (M2), the third switch (M3), and the fourth switch (M4) comprise a transistor.

10. The integrated circuit of claim 1, wherein a gain of the amplifier is based on the first resistance (Rs) and the second resistance (Rt).

11. The integrated circuit of claim 1, wherein the first resistor, the second resistor, and the third resistor each comprise polysilicon sheets having a first aspect ratio; wherein each of the first resistor, the second resistor, and the third resistor include a temperature coefficient which are substantially similar.

12. The integrated circuit of claim 11, wherein the first resistor, the second resistor, and the third resistor are disposed in a layer of the integrated circuit for reducing a temperature differential between the first resistor, the second resistor, and the third resistor.

13. The integrated circuit of claim 12, wherein the first switch (M1) and the fourth switch (M4) are interdigitated on the layer; wherein the second switch (M2) and the third switch (M3) are interdigitated on the layer.

14. The integrated circuit of claim 13, wherein the first switch (M1) and the fourth switch (M4) are arranged symmetrically to the second switch (M2) and the third switch (M3) about an axis.

15. The integrated circuit of claim 14, wherein the processor is configured to determine the first current (Isns) within 0.5 percent of an actual current across the first resistor.

16. The integrated circuit of claim 15, wherein the actual current is between 1 milli-amp and 2.5 amps inclusive.

17. The integrated circuit of claim 1, further comprising at least one analog-to-digital converter configured to convert the third voltage (Vo) to a first digital signal and provide the first digital signal to the processor.

18. The integrated circuit of claim 1, further comprising a rectifier, a current sense amplifier circuit, and a voltage regulator; wherein the current sense amplifier circuit includes the first resistor, the second resistor, the third resistor, the amplifier, the fourth resistor, and the fifth resistor; wherein the rectifier is configured to receive alternating current from a coil and generate a rectified voltage to the first node; wherein the voltage regulator is configured to regulate the second voltage (Vmid).

19. A system comprising:
a coil configured to receive wireless power;
an integrated circuit comprising:
    a rectifier configured to receive alternating current from the coil and generate a first voltage (Vrect);
    a current sense circuit comprising:
        a first resistor coupled between a first node and a second node; wherein the first resistor has a first resistance (Rs); wherein the first resistor is configured to carry a first current (Isns) across the first resistor when the first node has the first voltage (Vrect) and the second node has a second voltage (Vmid);
        an amplifier configured to output a third voltage (Vo);
        a second resistor and a third resistor; wherein the second resistor and the third resistor each have a second resistance (Rt); wherein the second resistor is coupled between the first node and a first input of the amplifier; wherein the third resistor is coupled between the second node and a second input of the amplifier;
        a fourth resistor and a fifth resistor; wherein the fourth resistor and the fifth resistor each have a third resistance (Rb); wherein the fourth resistor is coupled between a first output of the amplifier and ground; wherein the fifth resistor is coupled between a second output of the amplifier and ground; wherein the third voltage (Vo) is proportional to the third resistance (Rb); and
        a switch matrix comprising a first switch (M1) coupled between the first node and the second resistor, a second switch (M2) coupled between the second node and the third resistor, a third switch (M3) coupled between the second node and the second resistor, and a fourth switch (M4) coupled between the first node and the third resistor;

a voltage regulator configured to regulate the second voltage (Vmid); and a processor configured to determine the first current (Isns) based on one or more digital signals of the third voltage (Vo); wherein the processor is configured to measure an offset of the current sense by the first switch (M1), the second switch (M2), the third switch (M3), and the fourth switch (M4); wherein the processor is configured to compensate for the offset when determining the first current (Isns); and a battery charging system.

20. The system of claim 19, wherein the system is configurable between a receive mode and a transmit mode; wherein the first current (Isns) is provided from the first node to the second node in the receive mode; wherein the first current (Isns) is provided from the second node to the first node in the transmit mode; wherein the processor is configured to determine the first current (Isns) when the system is in the receive mode and in the transmit mode.

* * * * *